United States Patent
Terashita et al.

(10) Patent No.: US 9,690,202 B2
(45) Date of Patent: Jun. 27, 2017

(54) DEVELOPING METHOD, DEVELOPING APPARATUS AND STORAGE MEDIUM

(71) Applicant: TOKYO ELECTRON LIMITED, Tokyo (JP)

(72) Inventors: Yuichi Terashita, Koshi (JP); Hirofumi Takeguchi, Koshi (JP); Takeshi Shimoaoki, Koshi (JP); Kousuke Yoshihara, Koshi (JP); Tomohiro Iseki, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 14/845,827

(22) Filed: Sep. 4, 2015

(65) Prior Publication Data

US 2016/0070171 A1    Mar. 10, 2016

(30) Foreign Application Priority Data

Sep. 4, 2014   (JP) .................. 2014-180015
Jun. 4, 2015   (JP) .................. 2015-114140

(51) Int. Cl.
| | | |
|---|---|---|
| G03D 5/00 | (2006.01) | |
| G03B 27/42 | (2006.01) | |
| G03F 7/30 | (2006.01) | |
| H01L 21/67 | (2006.01) | |

(52) U.S. Cl.
CPC ........ G03F 7/3021 (2013.01); H01L 21/6715 (2013.01)

(58) Field of Classification Search
CPC ........... H01L 21/67051; H01L 21/6708; H01L 21/6715; H01L 21/67017; H01L 21/6719; H01L 21/02019; H01L 21/02052; H01L 21/0276; H01L 21/288; H01L 21/67057; H01L 21/67086; H01L 21/67225; H01L 21/67276; H01L 21/02054; H01L 21/02282; H01L 21/3105
See application file for complete search history.

(56) References Cited

U.S. PATENT DOCUMENTS

| | | | |
|---|---|---|---|
| 8,956,694 B2 | 2/2015 | Takeguchi et al. | |
| 2008/0013946 A1* | 1/2008 | Ono ................. | G03D 5/00 396/578 |
| 2013/0280425 A1* | 10/2013 | Yoshida ............ | H01L 21/02104 427/240 |

FOREIGN PATENT DOCUMENTS

| | | |
|---|---|---|
| JP | 11-260718 | 9/1999 |
| JP | 4893799 B2 | 3/2012 |

* cited by examiner

*Primary Examiner* — Mesfin Asfaw
(74) *Attorney, Agent, or Firm* — Burr & Brown, PLLC

(57) ABSTRACT

A developing method includes: forming a puddle of a developer on a surface of the substrate held by the substrate holding unit by a first developer nozzle; subsequently spreading the puddle of the developer over the whole substrate surface, by moving the first developer nozzle discharging the developer from a central or peripheral part to the peripheral or central part of the rotating substrate, with a contacting part of the first developer nozzle contacting with the puddle; supplying the developer from a second developer nozzle onto the rotating substrate, thereby to uniformize, in the substrate plane, distribution of a degree of progress of development by the developer spreading step; and removing the developer between the developer spreading step and the developer supplying step to remove the developer on the substrate.

16 Claims, 20 Drawing Sheets

DEVELOPING METHOD, DEVELOPING APPARATUS AND STORAGE MEDIUM

CROSS REFERENCE TO RELATED APPLICATIONS

This application is based upon and claims the benefit of priority from the prior Japanese Patent Applications No. 2014-180015 filed on Sep. 4, 2014, and No. 2015-114140, the entire contents of which are incorporated herein by reference.

FIELD OF THE INVENTION

The present invention relates to a method of developing an exposed substrate by supplying it with a developer.

BACKGROUND ART

In a lithography process in semiconductor device fabrication processes, a developing process for exposing a resist pattern is performed to a substrate, on which a resist film has been formed and which has been exposed with a predetermined pattern, by using a developer. It has been known a stationary developing method that forms a puddle on the substrate, by supplying a developer from a long nozzle extending parallel to the substrate surface with the substrate being rotated for a single revolution, or by scanning a long nozzle discharging a developer from one end to the other end of the substrate. In addition, it has been known another method that moves a developer nozzle discharging a developer in a radial direction of the substrate with the substrate being rotated (See JP4893799B2, paragraph [0026] and FIG. 8, for example). This method advantageous in that in-plane uniformity of line width and hole diameter of a pattern is improved as compared with the stationary developing method, because the developer having been supplied onto the substrate flows to be agitated due to centrifugal force.

Due to recent development of the semiconductor devices, smaller line width and hole diameter of a pattern is required. In order to comply with such a demand, a method for spreading a developer due to centrifugal force has been studied. In this method, since a developer is supplied locally to a position onto a substrate rotating at a relatively high speed, the developer spreads from the supplying position with the developer is swirling or rotating on the substrate due to centrifugal force. Thus, the concentration of the developer varies when the developer flows swirlingly. This phenomenon is one of the causes that prevent improvement of in-plane uniformity of the degree of progress of development.

JPH11-260718A (paragraph [0043] and FIG. 7) discloses a method for controlling the degree of progress of development. The method forms a puddle of a developer on the whole surface of the substrate, and thereafter changes temperature, thickness or liquid surface condition of the developer by supplying a gas to the developer from a head member facing the substrate, or supplying a small amount of pure water to the developer, so as to locally delay progress of development. This method corrects the degree of progress of development of a stationary development by means of a post treatment. This method requires a complicated apparatus and is difficult to apply to developing methods other than the stationary development method.

SUMMARY OF THE INVENTION

The object of the invention is to provide a developing method that develops an exposed substrate using a developer, and is capable of improving in-plane uniformity of the degree of progress of development.

In one embodiment of the present invention, there is provided a developing method, which includes: causing an exposed substrate to be held by a rotatable, substrate holding unit; a developer spreading step including: a step of forming a puddle of a developer on a surface of the substrate held by the substrate holding unit, by discharging the developer from a discharging port of a first developer nozzle, the first developer nozzle comprising a nozzle having a contacting part arranged to face the surface of the substrate, the contacting part being smaller than the surface of the substrate; and a step of subsequently spreading the puddle of the developer over the whole surface of the substrate, by moving the first developer nozzle discharging the developer from one of a central part and a peripheral part to the other of the central part and the peripheral part of the rotating substrate, with the contacting part contacting with the puddle; a developer supplying step that supplies the developer from a second developer nozzle onto the surface of the substrate with the substrate being rotated, thereby to uniformize, in a plane of the substrate, distribution of a degree of progress of development by the developer spreading step; and a developer removing step that is performed between the developer spreading step and the developer supplying step to remove the developer on the surface of the substrate.

The developing method may further include any one or more of the features mentioned below.
(a) The developer supplying step is a development adjusting step that supplies the developer to an underdeveloped area as compared with other areas, thereby to accelerate development in the underdeveloped area.
(b) In the feature (a), the developer spreading step is performed prior to the development adjusting step.
(c) In the feature (a), the step of spreading the puddle of the developer moves the first developer nozzle from the central part to the peripheral part of the rotating substrate, and the development adjusting step comprises a step of discharging the developer from the second developer nozzle while moving a supply position of the developer from one of the central part and the peripheral part to the other of the central part and the peripheral part of the substrate.
(d) In the feature (a), the development adjusting step comprises a step of discharging the developer from the second developer nozzle locally to a radial position on the substrate. In this case, the step of discharging the developer locally is performed with the second developer nozzle being stopped. In the development adjusting step, a plurality of radial positions, to which the second developer nozzle discharges the developer, are set on the substrate, and wherein the radial positions are separated from each other with respect to a radial direction of the substrate. The step of discharging the developer locally is performed with the second developer nozzle being stopped, and at least one of a developer discharging rate, a number of revolution of the substrate per unit time and a developer supplying period from the second developer nozzle at one of the plurality of radial positions is different from that at another one of the plurality of radial positions.
(e) The developer supplying step is a development preparation step that supplies the developer to form a liquid film on the surface of the substrate so as to make preparation for the developer spreading step.

(f) In the feature (e), the first developer nozzle moves from the central part to the peripheral part of the substrate in the step of spreading the puddle of the developer.

(g) In the feature (a), the second developer nozzle is composed of the nozzle having the contacting part. In this case, the first developer nozzle and the second nozzle are composed of a common nozzle.

(h) In the feature (a), the developer removing step is a step of rotating the substrate thereby spinning off the developer from the substrate.

The method in the one embodiment forms a puddle on a part of a surface of a substrate, and spreads the puddle over the whole surface of the substrate, by moving a first developer nozzle comprising a nozzle, having a developer discharge port and a contacting part, above the rotating substrate, while supplying the developer to the puddle between the substrate surface and the contacting surface facing the substrate surface. Thus, in-plane uniformity of the degree of progress of development is improved. Furthermore, a supplying process of the developer using a second developer nozzle is combined with the developing process using the first developer nozzle. When performing these processes, the developer existing on the substrate surface having been supplied beforehand is removed, so that the distribution of degree of progress of development is uniformized. As a result, the degree of progress of development is improved further, so that in-plane uniformity of line width and hole diameter of a pattern is improved.

Figure 1:
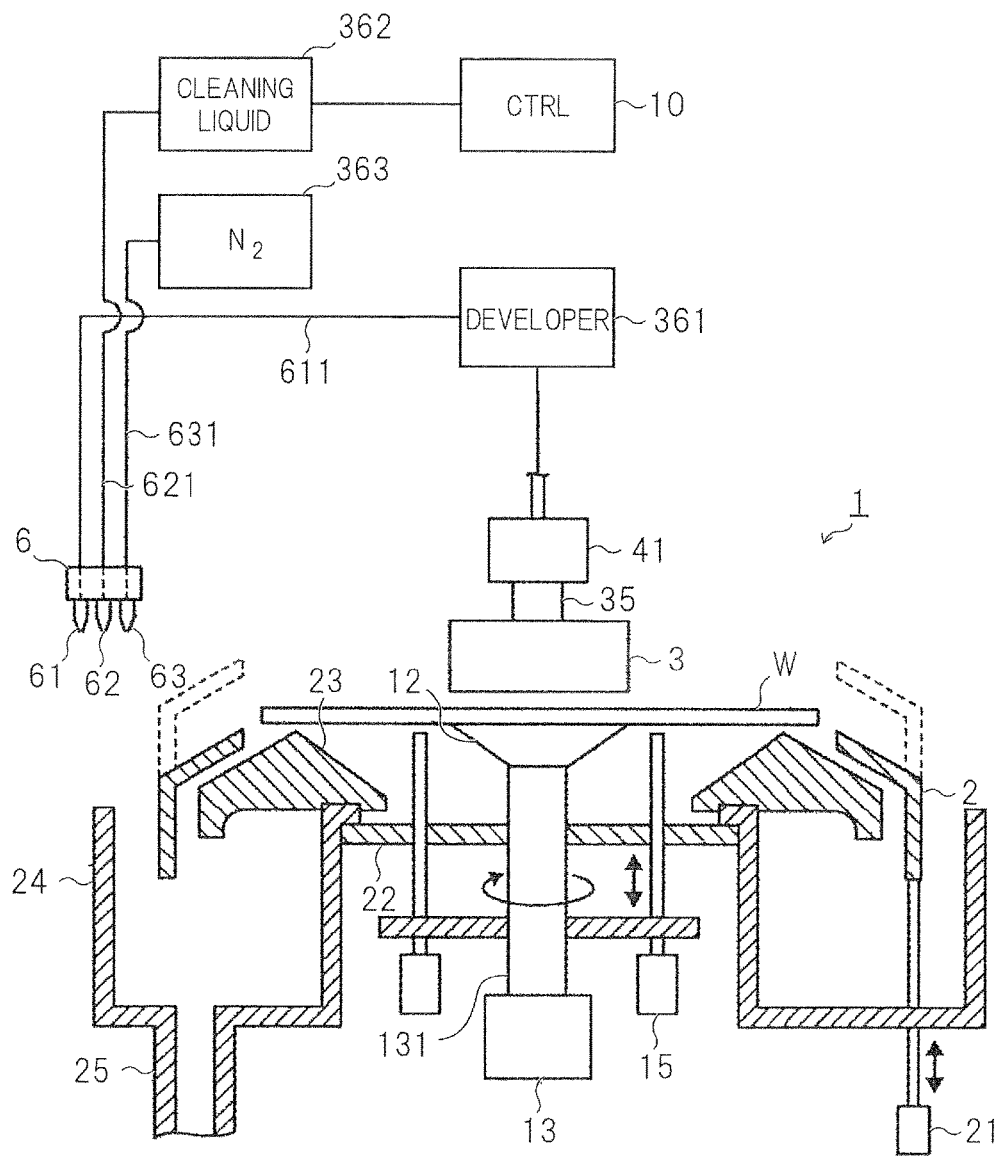
FIG. 1 is a vertically-sectioned side view of a developing apparatus in one embodiment of the present invention.

DETAILED DESCRIPTION OF THE INVENTION (First Embodiment)

The structure of a developing apparatus 1 according to a first embodiment is described with reference to FIGS. 1 to 3.

The developing apparatus 1 includes a spin chuck 12 as a substrate holding unit, a cup 2 for receiving liquids, a main developer nozzle (first developer nozzle) 3 and an adjusting developer nozzle (second developer nozzle) 61.

The spin chuck 12 is configured to suction a central part of a rear surface of a wafer W so as to hold the wafer W horizontally. The spin chuck 12 is rotatable about a vertical axis, by a rotation mechanism 13 through a rotation shaft 131.

The cup 2 is arranged to surround the wafer W held by the spin chuck 12. The cup 2 has a substantially cylindrical shape, and an upper part thereof is inclined inward. The cup 2 can be moved upward and downward by an elevation mechanism 21, between a delivery position (the position shown by solid lines in FIG. 1), at which the wafer W is transferred to and from the spin chuck, 12 and a treatment position (the position shown by the broken lines in FIG. 1), at which the wafer W is subjected to a developing process.

A circular plate 22 is disposed below the wafer W held by the spin chuck 12. A guide member 23 having a chevron shape in longitudinal section is arranged annularly outside the circular plate 22. The guide member 23 is configured to guide a developer and a cleaning liquid flowing from the wafer W to a liquid receiving unit 24 disposed outside the circular plate 22. The liquid receiving unit 24 is formed as an annular recess, and is connected to a draining unit, not shown, through a drain pipe 25. Transfer pins 14 for transferring the wafer W to and from a substrate transport mechanism, not shown, are provided below the wafer W held by the spin chuck 12. The transfer pins 14 can be moved upward and downward by an elevation mechanism 15, between a position projecting above the spin chuck 12 for transferring the wafer W, and a position retracted below the spin chuck 12.

Figure 3:
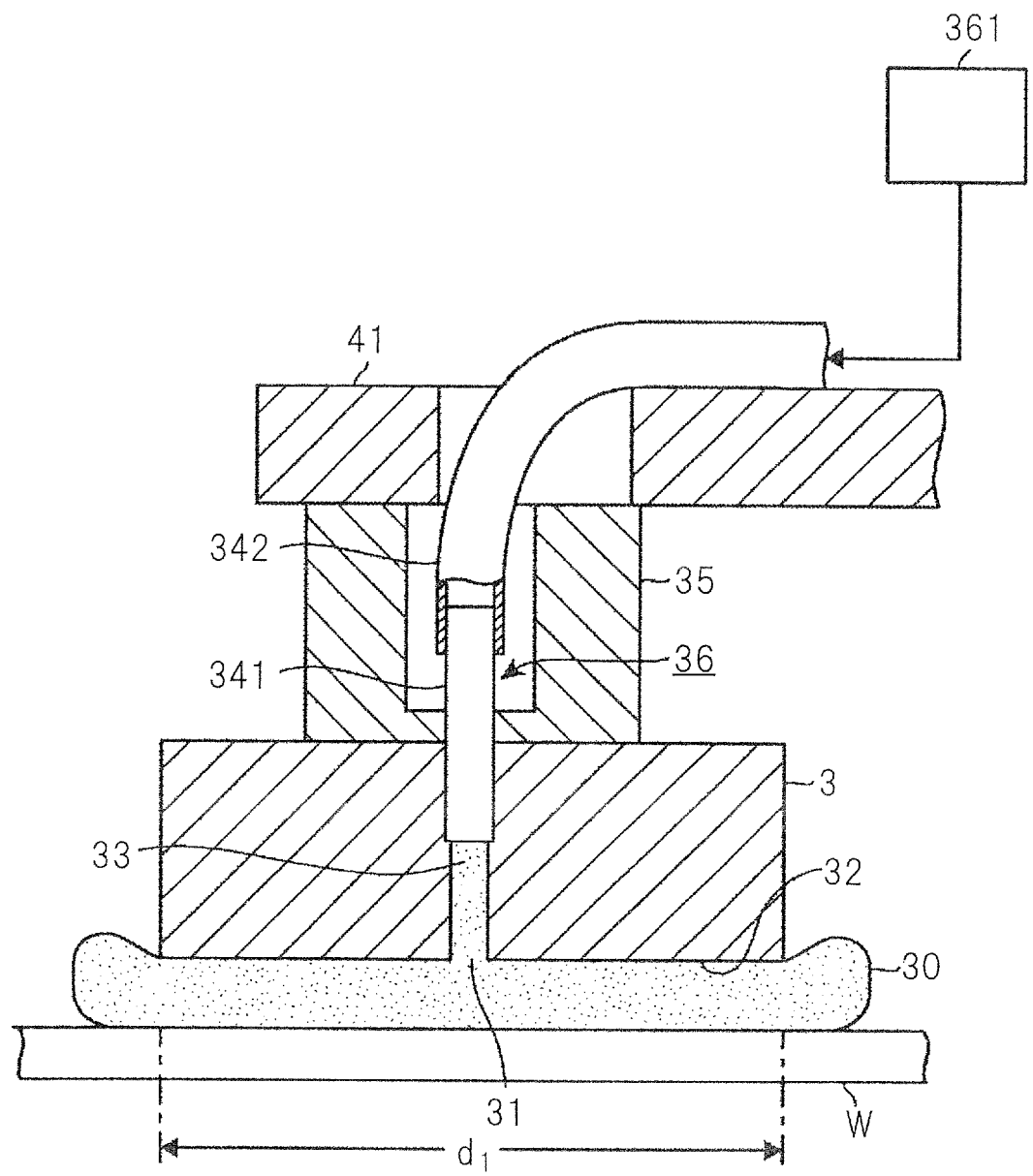
FIG. 3 is a vertically-sectioned side view of a main developer nozzle provided in the developing apparatus.

As shown in the vertically-sectioned side view of FIG. 3, the main developer nozzle 3 is formed of a nozzle having a discharging port 31 for discharging a developer to form a puddle 30 on a surface of the wafer W, and a contacting part 32 arranged to face the surface of the wafer W. The discharging port 31 is opened to the contacting part 32. The contacting part 32 is smaller than the surface of the wafer W. The main developer nozzle 3 has, e.g., a cylindrical shape. The bottom surface of the developer nozzle 3 serves as the contacting part 32. A vertical through-hole 33 is formed in a central part of the main developer nozzle 3. The lower end of the through-hole 33 serves as the discharging port 31. The discharging port 31 is opened, e.g., around a central axis of the main developer nozzle 3, i.e., in a central part of the contacting part 32. A developer supply pipe 36 is inserted to an upper part of the through-hole 33, and the developer supply pipe 36 is in communication with the discharging port 31 through the through-hole 33.

The developer supply pipe includes a straight pipe 341 inserted into the through-hole 33 and a resin tube 342 connected to a proximal end of the straight pipe 341. On the other hand, a lower part of the through-hole 33 into which the straight pipe 341 is inserted has a reduced diameter, so that the distal end of the straight pipe 341, which is inserted into the upper part of the through-hole 33, is stopped by a step on an upper end of the reduced-diameter part. Thus, the developer supply pipe 36 is connected in position to the main developer nozzle 3. The connection between the main developer nozzle 3 and the developer supply pie 36 is not limited to the illustrated embodiment, and it is possible employ a structure in which a plug provided on the distal end of the developer supply pipe 36 is inserted into a socket provided on an upper surface of the main developer nozzle 3, or a structure in which a flange provided on the distal end of the developer supply pipe 36 is joined to the upper surface of the main developer nozzle 3.

The contacting part 32 is arranged to face the surface of the wafer W placed on the spin chuck 12. When the diameter of the wafer W is 300 mm, for example, the diameter dl of the contacting part 32 may be between 30 mm to 200 mm. In this embodiment, the diameter dl of the contacting part 32 is set 100 mm. In order that the developer is stirred by utilizing surface tension, a resin is used as a material of the main developer nozzle 3, for example. PFA (tetrafluoroethylene.perfluoroalkyl vinylether copolymer), PTFE (polytetrafluoroethylene), etc., can be used as the resin material.

Figure 2:
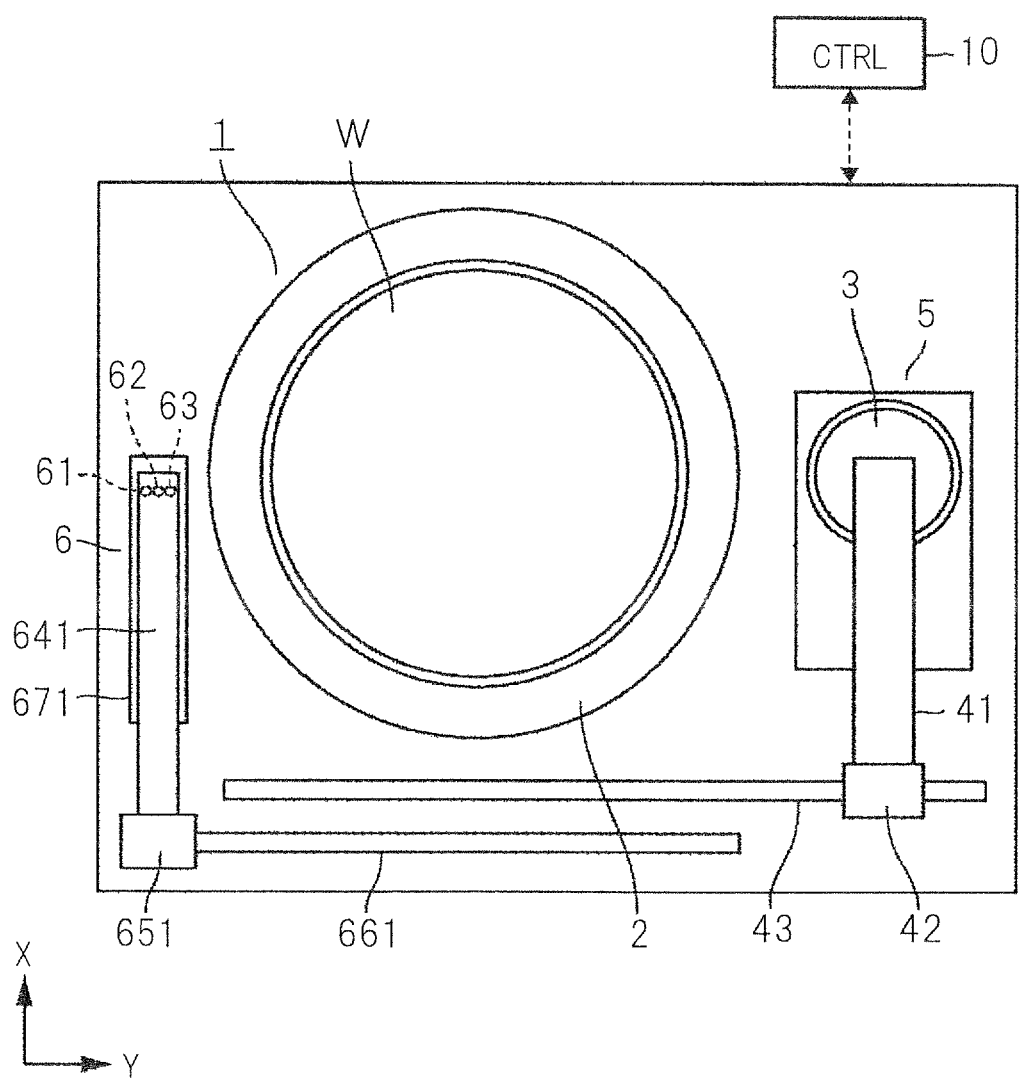
FIG. 2 is a plan view of the developing apparatus.

As shown in FIGS. 2 and 3, the upper surface of the main developer nozzle 3 is fixed to the distal end of an arm 41 through a support member 35, and the proximal end of the arm 41 is connected to a moving mechanism 42. The moving mechanism 42 has a function for moving along a horizontally-extending guide rail 43, thereby moving the main developer nozzle 3 along the radial direction of the wafer W held by the spin chuck 12. In addition, the moving mechanism 42 has a function for moving the arm 41 upward and downward, thereby moving the main developer nozzle 3 upward and downward, between a treatment position at which the developer is supplied onto the wafer W held by the spin chuck 12, and a height position at which the moving mechanism 42 is moved along the guide rail 43. A standby unit 5 formed of a nozzle bath having a draining port is disposed outside the cup 2. The standby unit 5 can be fitted in the distal end of the main developer nozzle 3.

The developer supply pipe 36 connected to the main developer nozzle 3 is fixed on the arm 41 and the support member 35. As shown in FIGS. 1 and 3, a supply source 361 of a developer for developing a negative type resist, for example, is connected to the upstream end of the developer supply pipe 36. The developer supply source 361 has a pump, a valve and so on, and is configured to supply the developer to the main developer nozzle 3 in accordance with a control signal from a control unit 10 which will be described below.

Due to the aforementioned structure, the developer supplied from the supply source 361 is discharged from the developer supply pipe 36 onto the wafer W through the discharging port 31. The structure of the discharging port 31 is not limited to the illustrated embodiment in which the lower end of the through-hole 33 is opened toward the wafer W. For example, a flat developer circulation space extending along the contacting part 32 may be formed below the through-hole 33, and a lot of discharging ports in communication with the circulation space may be formed over the whole surface of the contacting part 32 positioned below the circulation space.

The developing apparatus 1 further includes a nozzle unit 6. As shown in FIGS. 1 and 2, the nozzle unit 6 includes an adjusting developer nozzle 61, a cleaning liquid nozzle 62 for supplying a cleaning liquid, such as DIW (DeIonized Water) or MIBC (4-methy-2-pentanol), onto the surface of the wafer W, and a gas nozzle 63 for spraying a gas onto the surface of the wafer W. The adjusting developer nozzle 61, the cleaning liquid nozzle 62 and the gas nozzle 63 are mounted on the distal end of a common arm 641.

In order to uniformize distribution of the degree of progress of development in a plane of the wafer W that has been developed by the main developer nozzle 3, the adjusting developer nozzle 61 is configured to supply the developer again to the wafer W. The adjusting developer nozzle 61 in this embodiment is formed of a short pipe extending vertically downward. The adjusting developer nozzle 61 has on its lower end an opening (not shown) of, e.g., 0.5 mm to 3 mm. The developer is supplied to the wafer W through the opening serving as a discharging port. The cleaning liquid nozzle 62 and the gas nozzle 63 are also formed of short pipes each having a lower opening.

As shown in FIG. 1, the adjusting developer nozzle 61, the cleaning liquid nozzle 62 and the gas nozzle 63 are connected to the developer supply source 361, a cleaning liquid supply source 362 and a gas supply source 363 for supplying gas for drying the wafer W, e.g., nitrogen gas, through supply channels 611, 621 and 631, respectively. The supply sources 361 to 363 respectively have pumps, valves and so on, so as to supply the developer, the cleaning liquid and nitrogen gas to the adjusting developer nozzle 61, the cleaning liquid nozzle 62 and the gas nozzle 63, in accordance with control signals from the controller unit 10.

The arm 641 is supported by a moving mechanism 651 so as to be movable upward and downward. The moving mechanism 651 is configured to be movable along a horizontally-extending guide rail 661. As a result, each of the adjusting developer nozzle 61, the cleaning liquid nozzle 62 and the gas nozzle 63 is movable between its treatment position at which fluid (i.e., the developer, the cleaning liquid, the gas) is supplied onto the wafer W on the spin chuck 12, and its standby position at which the nozzles 61 to 63 stands by. The moving mechanism 42 and the moving mechanism 651 can move the main developer nozzle 3 and the nozzle unit 6 between the standby positions and the treatment positions, without the main developer nozzle 3 and the nozzle unit 6 being interfered with each other.

As shown in FIG. 2, the standby position of the nozzles 61 to 63 and the standby unit 5 are located on opposite sides the cup 2 with respect to the moving direction of the arm 641. A nozzle bath 671 in which the respective nozzles 61 to 63 stand by is disposed at the standby position.

The developing apparatus 1 having the above-described structure is provided with the control unit 10 comprising a computer. The control unit 10 includes a program storage unit, not shown, and a program including steps for performing the development, which is described below, is stored in the program storage unit. The control unit 10 outputs control signals to the respective elements of the developing apparatus 1 based on the program, so as to control the respective operations, such as the movement of the main developer nozzle 3 and the nozzle unit 6 by the moving mechanisms 42 and 651, the supply of the developing liquid, the cleaning liquid and nitrogen gas from the respective supply sources 361 to 363 to the main developer nozzle 3, the adjusting developer nozzle 61, the cleaning liquid nozzle 62, and the gas nozzle 63, the rotation of the wafer W by the spin chuck 12, and the upward and downward movement of the transfer pins 14. The program storage unit comprises a storage medium such as a hard disc, a compact disc, a magneto optical disc, a memory card, etc.

Various design parameters of the main developer nozzle 3 provided on the above developing apparatus 1 are, for example, as follows. The horizontal moving speed of the main developer nozzle 3, which moves above the wafer W held by the spin chuck 12, is, e.g., 10 mm/sec to 100 mm/sec, more preferably, 10 mm/sec to 50 mm/sec. The diameter of the contacting part 32 is, e.g., 50 mm to 200 mm. The rotation speed (the number of revolution per unit time) of the wafer W is preferably 100 rpm or less, more preferably, 10 rpm to 100 rpm, in order to prevent splashing of the developer upon discharge of the developer onto the wafer W.

Figure 4:
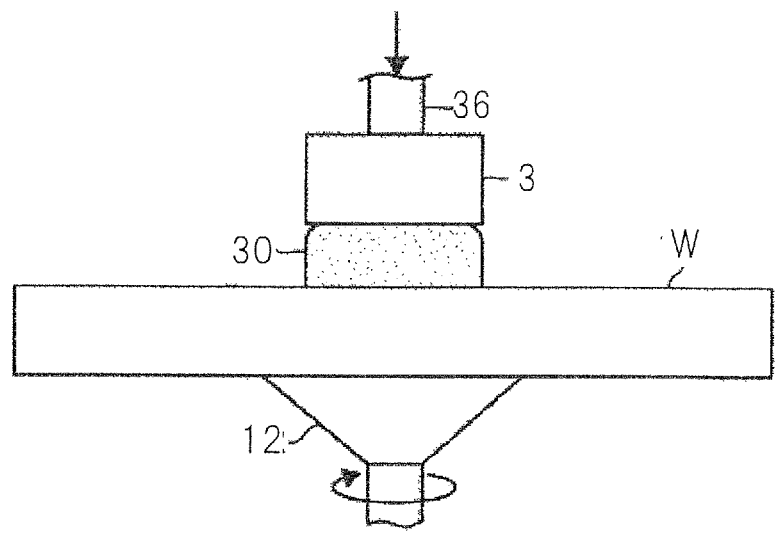
FIG. 4 is a first operation chart of the developing apparatus.

The operation of the developing apparatus 1 as structured above is described with reference to FIGS. 4 to 10. Firstly, a wafer W with a resist film, which has been exposed, is loaded into the developing apparatus 1 by a substrate transport mechanism, not shown. The wafer W is held by the spin chuck 12, and then the main developer nozzle 3 is moved from the standby unit 5 to a position above a central part of the wafer W. As schematically shown in FIG. 4, the main developer nozzle 3 is lowered such that the contacting part 32 is located several millimeters above the upper surface of the wafer W. Then, the developer is supplied from the discharging port 31 to the wafer W, while the wafer W is stopped, or while the wafer W is rotated at a rotation speed of 10 rpm or less, for example, in the clockwise direction when viewed from above. Thus, a puddle 30 in contact with the contacting part 32 is formed between the contacting part 32 of the main developer nozzle 3 and the wafer W (FIGS. 3 and 4). The discharging rate of the developer is 60 to 600 ml/min, for example, although it depends on a planar dimension of the contacting part 32.

Figure 5:
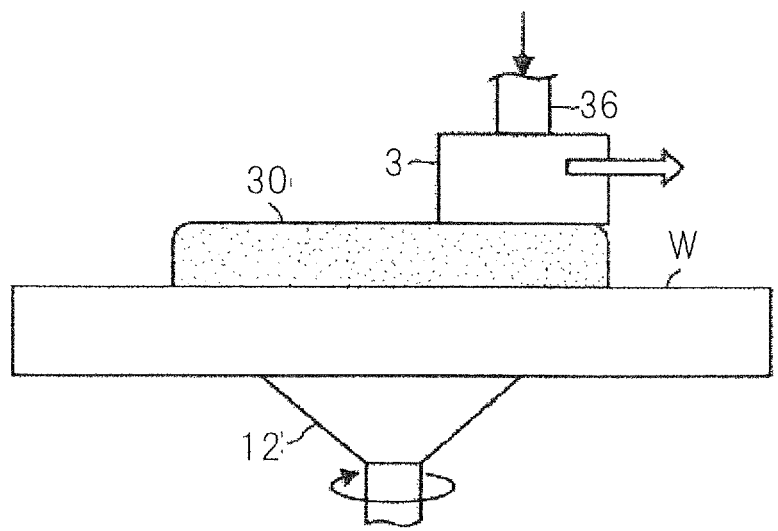
FIG. 5 is a second operation chart of the developing apparatus.

Then, the rotation speed of the wafer W is adjusted to 30 to 100 rpm. While the developer is continuously discharged, the puddle 30 is spread on the surface of the wafer W, by moving the main developer nozzle 3 from the central part toward a peripheral part of the wafer W (FIG. 5). The main developer nozzle 3 is moved for 2 to 15 seconds, until the edge of the contacting part 32 reaches the edge of the wafer W, whereby the puddle 30 covering the while surface of the wafer W is formed. The operation explained with reference to FIGS. 4 and 5 corresponds to the developer spreading step.

Figure 6:
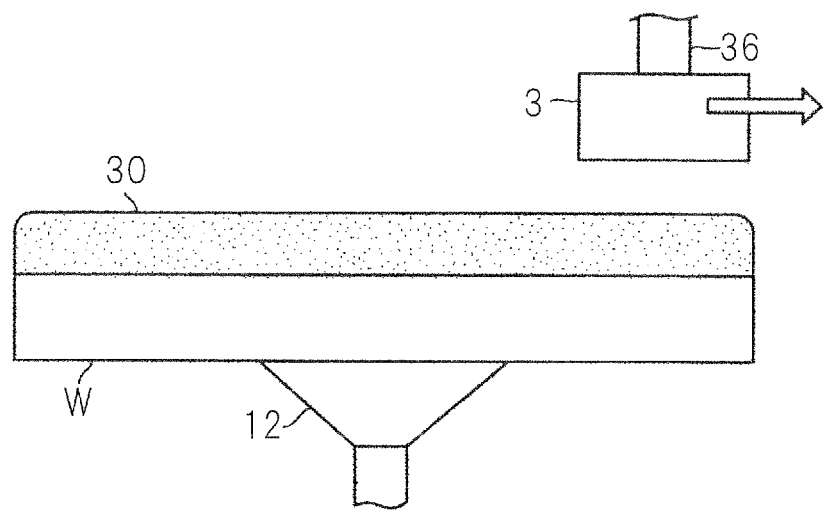
FIG. 6 is a third operation chart of the developing apparatus.

After the puddle 30 has been formed over the whole surface of the wafer W, the supply of the developer from the main developer nozzle 3 and the rotation of the wafer W are stopped, and the main developer nozzle 3 is retracted to the standby unit 5. Then, stationary development by the puddle 30 formed on the wafer W is performed, while the wafer W is kept stationary (FIG. 6). The stationary development period is set 1 to 20 seconds, for example, although it depends on a period for forming the puddle 30 and the total development period.

As described below the experiment result, the inventors have found out that, when the developer is applied by using the main developer nozzle 3 provided with the contacting part 32 arranged to face the surface of the wafer W, the degree of progress of development varies along the radial direction of the wafer W. Thus, on the surface of the developed wafer W, there is established a distribution having a radially-different degree of progress of development, while the degree of progress of development about the rotating center of the wafer W is substantially uniform.

The distribution having different degrees of progress of development brings about the following phenomena. When the pattern to be developed on a resist film is a line and space pattern (hereinafter also referred to as "LS"), the width of lines is narrower (the width of spaces is thicker) in overdeveloped areas, while the width of lines is thick (the width of spaces is narrow) in underdeveloped areas. On the other hand, when the pattern to be developed is a contact hole pattern (hereinafter also referred to as "CH"), the diameter of CH is larger in overdeveloped areas, while the diameter of CH is smaller in underdeveloped areas.

The distribution having different degrees of progress of development may be caused by difference of a period in which a resist film and a developer are in contact with each other (contact period), and influence of concentration distribution of dissolved components dissolved from the resist film into the developer. As described with reference to FIGS. 4 and 5, when the main developer nozzle 3 is moved from the central part to the peripheral part of the wafer W (hereinafter the operation for moving the main developer nozzle 3 and the adjusting developer nozzle 6 from the central part to the peripheral part of the wafer W is also referred to as "scan-out"), the contact period of the wafer W and the developer, which starts when the developer is supplied and ends when the developer is removed, is longer in the central part and shorter in the peripheral part. The longer the contact period in which the resist film and the developer is in contact with each other is, the larger the degree of progress of development becomes.

Meanwhile, along with the progress of development, polymer of the resist film is dissolved into the developer forming the puddle 30 to become dissolved components, which suppress the progress of development. Focusing on the concentration of the dissolved components, the concentration of the dissolved components increases as the period in which the resist film and the developer are in contact with each other is longer. Thus, taking account only of the contact period, the concentration of the dissolved components is higher in the central part of the wafer W, and is lower in the peripheral part of the wafer W. However, since flow of the developer that flows from the central part toward the peripheral part is formed on the surface of the rotating wafer W, the concentration of the dissolved components in the developer is also subjected to the influence of the flow of the developer.

The distribution of degree of progress of development is formed under the influence of the period in which the resist film and the developer are in contact with each other, the concentration of the dissolved components in the puddle 30, the flow formed in the puddle 30 and so on.

The developing apparatus 1 in this embodiment performs an adjustment for uniformizing the distribution of degree of progress of development in a plane of the wafer W, by supplying the developer again to the surface of the wafer W by using the adjusting developer nozzle 61.

However, as described above, the puddle 30 after the stationary development contains the dissolved components that suppress progress of development. Thus, even when the developer is again supplied to the puddle 30 containing the dissolved components, there is a possibility that the degree of progress of development cannot be sufficiently adjusted.

Figure 7:
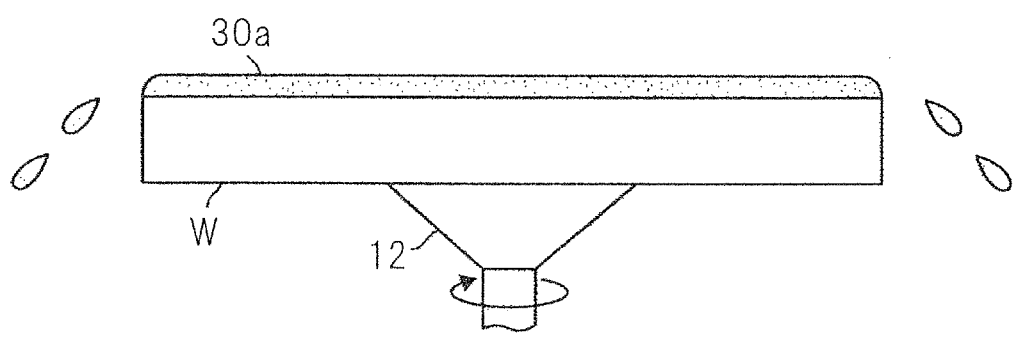
FIG. 7 is a fourth operation chart of the developing apparatus.

Thus, as shown in FIG. 7, the developer containing the dissolved components is spun off to be removed from the surface of the wafer W, by rotating, after the stationary development, the wafer W at a rotation speed of, e.g., 100 to 1000 rpm. As a result, a liquid film 30a, which is thinner than the puddle 30 formed during the stationary development, is formed on the surface of the wafer W, or the surface of the wafer W is dried (FIGS. 7 and 8 and FIGS. 12 to 14 show that the liquid film 30a is formed). The period for spinning off the developer is 1 second or less, for example. After the spinning-off operation, a rinsing operation may be performed by supplying the cleaning liquid onto the surface of the wafer W.

Figure 8:
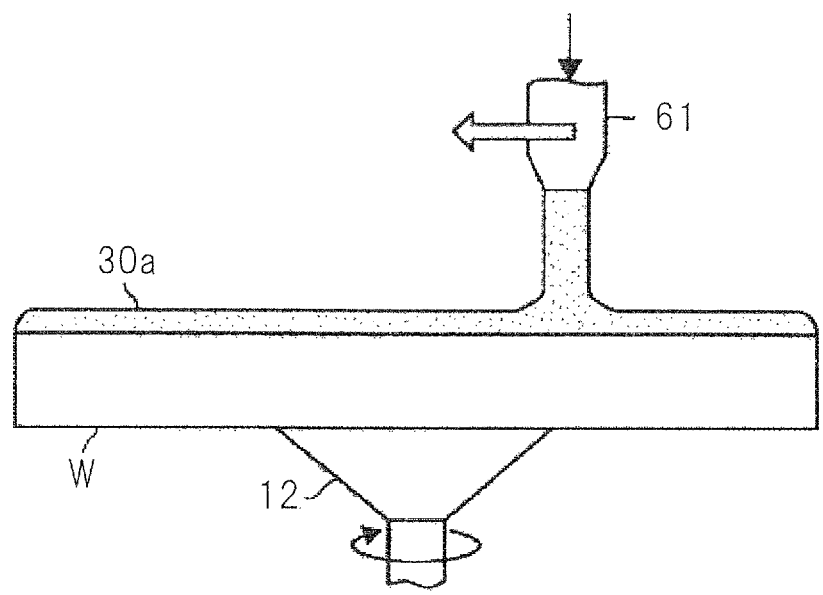
FIG. 8 is a fifth operation chart of the developing apparatus.

After the spinning-off of the developer, the rotation speed of the wafer W is adjusted within a range between 100 and 2000 rpm, and the adjusting developer nozzle 61 (nozzle unit 6) is moved from the nozzle bath 671 toward the wafer W, such that the adjusting developer nozzle 61 is moved radially toward the central part of the wafer W. When the adjusting developer nozzle 61 reaches a position above a position that is radially inside by 5 mm from the edge of the wafer W, the discharging of the developer form the adjusting developer nozzle 61 onto the wafer W is started (FIG. 8). Since the developer containing the dissolved components is spun off and then the developer is again supplied, the development is accelerated in the area to which the developer is supplied again. Thus, the underdevelopment is compensated, whereby the adjustment for uniformizing the distribution of degree of progress of development can be performed.

The adjusting developer nozzle 61 is radially moved, over a period of 5 to 20 seconds, from the peripheral part to the central part of the wafer W, at a moving speed of 10 to 100 mm/sec, while the adjusting developer nozzle 61 discharges the developer at a discharging rate of, e.g., 10 to 600 ml/min (hereinafter an operation for moving the main developer nozzle 3 and the adjusting developer nozzle 6 from the peripheral part to the central part of the wafer W is also referred to as "scan-in"). By discharging the developer while moving the adjusting developer nozzle 61 above an area which requires the adjustment of the degree of progress of development, the development in the underdeveloped area is accelerated, whereby the distribution of degree of progress of development can be uniformized.

The above operation explained with reference to FIG. 8 corresponds to the developer supplying step that supplies the developer onto the surface of the rotating wafer W, in particular, the development adjusting step that supplies the developer to underdeveloped areas as compared with other areas, thereby to accelerate development in the underdeveloped areas.

A preliminary experiment may be conducted for studying a distribution of degree of progress of development with the use of only the main developer nozzle 3. Based on the preliminary experiment result, areas whose degree of progress of development should be adjusted by using the adjusting developer nozzle 61 are determined beforehand. The graphs shown in FIGS. 9 and 10 schematically show the distribution of degree of progress of development in the radial direction of the wafer W.

Figure 9:
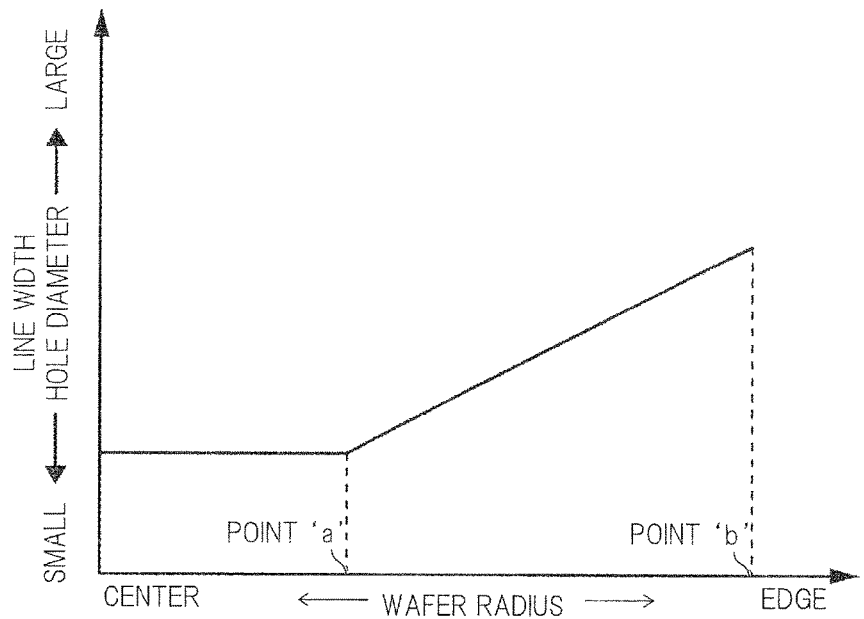
FIG. 9 is a first explanatory chart showing the distribution of degree of progress of development using a first developer nozzle.
Figure 9:
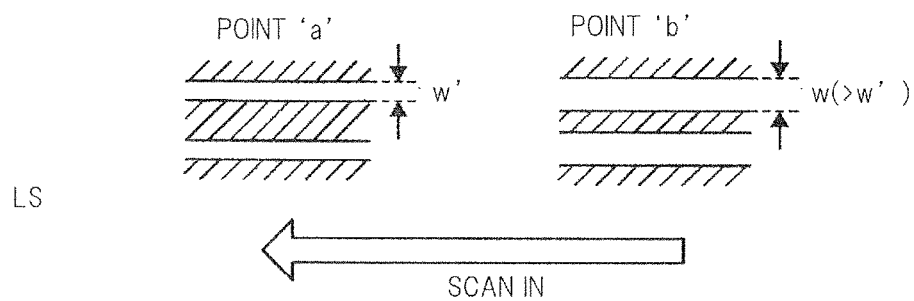
Figure 9:
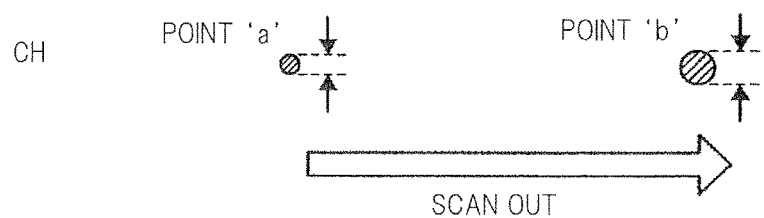
Figure 10:
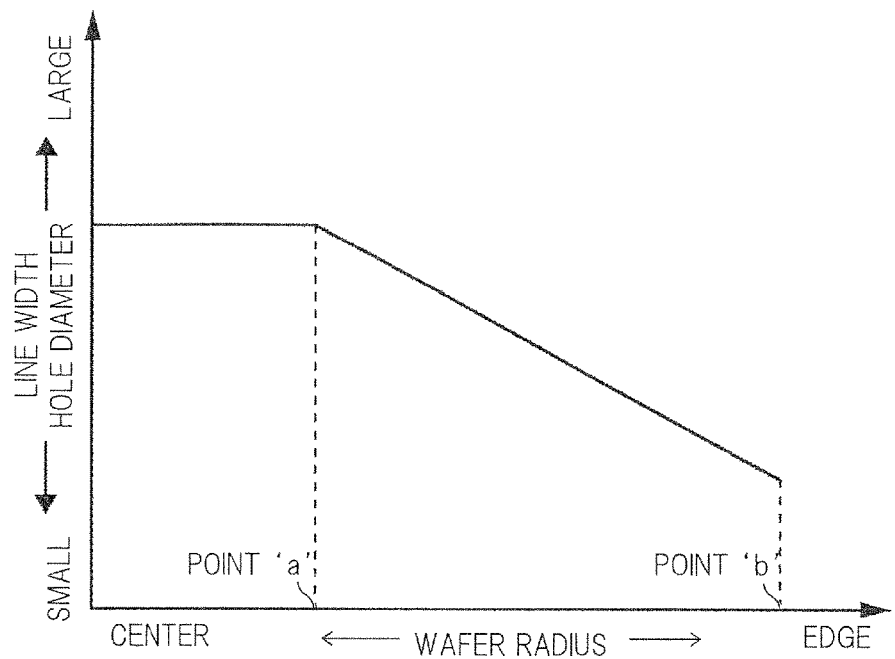
FIG. 10 is a second explanatory chart showing the distribution of degree of progress of development.
Figure 10:
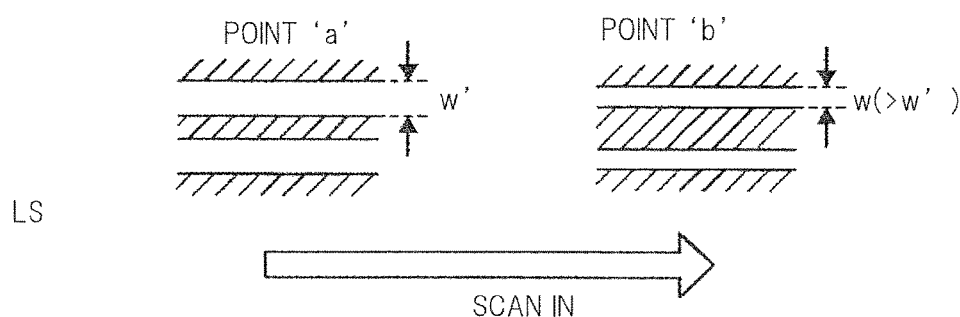
Figure 10:
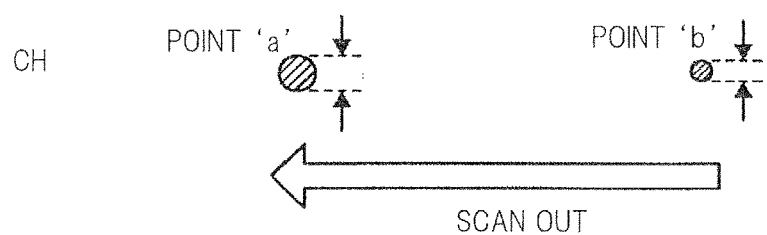

For example, in the case of LS formed on the wafer W, a line width of LS shows the distribution shown in the graph of FIG. 9. In this case, as described in the lower part of the graph of FIG. 9, since the line width "w" of the LS at the point "b" in the peripheral part of the wafer W is larger than the line width "w'" at the point "a" in the central part, it can be understood that the the peripheral part is underdeveloped.

On the other hand, when the peripheral part of the wafer W is underdeveloped, the hole diameter of CH is smaller. Thus, the hole diameter of CH shows the distribution shown in FIG. 10 in which the hole diameter "d'" of CH at the point "b" in the peripheral part of the wafer W is smaller than the hole diameter "d" at the point "b" in the central part.

Thus, in the developing process using the adjusting developer nozzle 61, there is performed the scan-in operation in which the supply of the developer is started from the underdeveloped peripheral part, in order that a period in which the resist film and the developer are in contact with each other in the peripheral part is longer than that in the central part. Thus, development in the underdeveloped area is accelerated, whereby the distribution of degree of progress of development can be uniformized.

Contrary to the above example, suppose that the line width of LS shows the distribution shown in the graph of FIG. 10. In this case, as described in the lower part of the graph of FIG. 10, since the line width "w" of LS at the point "a" in the central part of the wafer W is larger than the line width "w" at the point "b" in the peripheral part, it an be understood that the central area is underdeveloped.

When the central part of the wafer W is underdeveloped, CH shows the distribution shown in the graph of FIG. 9 in which the hole diameter "d'" of CH at the point "a" in the central part of the wafer W is smaller than the hole diameter "d" at the point "b" in the peripheral part.

In this case, there is performed the scan-out operation in which the supply of the developer is started from the underdeveloped central part, in order that a period in which the resist film and the developer are in contact with each other in the central part is longer than that in the peripheral part. Thus, development in the underdeveloped area is accelerated, whereby the distribution of degree of progress of development can be uniformized.

The supply of the developer by the adjusting developer nozzle 61 may not be performed over the whole surface of the wafer W, and the scan-in operation and the scan-out operation may be performed only to underdeveloped areas. Parameters for adjusting the degree of progress of development include the number of repetition of the operation for supplying the developer while moving the adjusting developer nozzle 61, a speed at which the adjusting developer nozzle 61 is moved, the discharging rate of the developer discharged from the adjusting developer nozzle 61, and the rotation speed of the wafer W. As to the respective parameters, the degree of progress of development per unit time can be accelerated, by increasing the number of repetition of the developer supplying operation, by decreasing the moving speed of the adjusting developer nozzle 61, by increasing the discharging rate of the developer, or by decreasing the rotation speed of the wafer W. Further, the supplying rate of the developer may be changed by changing the moving speed of the adjusting developer nozzle 61 in the course of the movement, or by temporarily stopping the movement.

In the conventional developing process in which the exposed wafer W is developed by using the adjusting developer nozzle 61 having a short-pipe shape, the rotation speed of the wafer W has to be increased up to 100 rpm or more, in order to spread a small amount of developer over the whole surface of the wafer W. However, in this conventional method, it was found that the degree of progress of development is uneven in a circumferential direction of the wafer W, so that there are some areas, in which the degree of progress of development are different from the other areas, sparsely radiating from the central part to the peripheral part of the wafer W (see FIG. 31). In particular, this phenomenon becomes noticeable at an initial development stage where the degree of progress of development per unit time is larger.

On the other hand, when the degree of progress of development is adjusted by using the adjusting developer nozzle 61, the main part of the developing reaction has been completed by the developer supplied from the main developer nozzle 3 beforehand. Since the developing process by using the adjusting developer nozzle 61 is a supplemental developing process, the change of the line width of LS and the hole diameter of CH in the adjustment process is smaller than those in the whole developing process. In addition, in the later stage of the developing process in which the degree of progress of development per unit time is smaller, it is found that the aforementioned radial distribution (FIG. 31) is unlikely to be formed even when the developing process is performed while the wafer W is rotated at a relatively high speed. Thus, even when the adjustment is performed by increasing the rotation speed of the wafer W up to, e.g., 1000 rpm or more, the degree of the radial distribution occurred in the conventional method is not problematic.

Returning to the explanation of the treatment of the wafer W by the developing apparatus 1, when the adjustment of the degree of progress of development, which supplies the developer while moving the adjusting developer nozzle 61, is finished, the supply of the developer from the adjusting developer nozzle 61 is stopped. Then, the cleaning nozzle 62 is moved to a position above the central part of the wafer W, and a cleaning liquid is supplied, while the wafer W is rotated at a rotation speed of 1000 to 2000 rpm. By spreading the cleaning liquid over the whole surface of the wafer W, the cleaning process for removing the developer on the surface of the wafer W is performed.

After the cleaning liquid process has been performed for a predetermined period, the supply of the cleaning liquid is stopped. Then, while the wafer W is continuously rotated, the gas nozzle 63 is moved to a position above the central part of the wafer W, and supply of nitrogen gas is started. Due to the rotation of the wafer W and the supply of nitrogen gas, the cleaning liquid is removed from the surface of the wafer W, and the wafer W is dried. The cleaning process by the cleaning liquid and the supply of gas for drying the wafer W may be omitted depending on circumstances. Thereafter, the nozzle unit 6 is retracted toward the nozzle bath 671, and the wafer W is transferred to the external substrate transport mechanism so as to be unloaded from the developing apparatus 1, according to an operation reverse to the loading operation.

With the developing apparatus in this embodiment, the below advantages can be obtained. A puddle is formed on a part of the surface of a wafer W, and the puddle 30 is spread over the whole surface of the wafer W by moving the discharging port 31 of the developer and the contacting part 32 above the rotating wafer W, while supplying a developer to the puddle 30 between the contacting part 32 facing surface of the wafer W and the wafer W. Thus, uniformity of the degree of progress of development in a plane of the wafer W is improved. In the developing process using the main developer nozzle 3, a distribution having different degrees of progress of development is formed in a radial direction of the wafer W. Thus, following thereto, by using the adjusting developer nozzle 61, the distribution of the degree of progress of development can be easily uniformized. As a result, the uniformity of the degree of progress of development can be further improved, whereby excellent in-plane uniformity can be obtained as to the line width and a hole diameter of a pattern.

(Second Embodiment)

Figure 12:
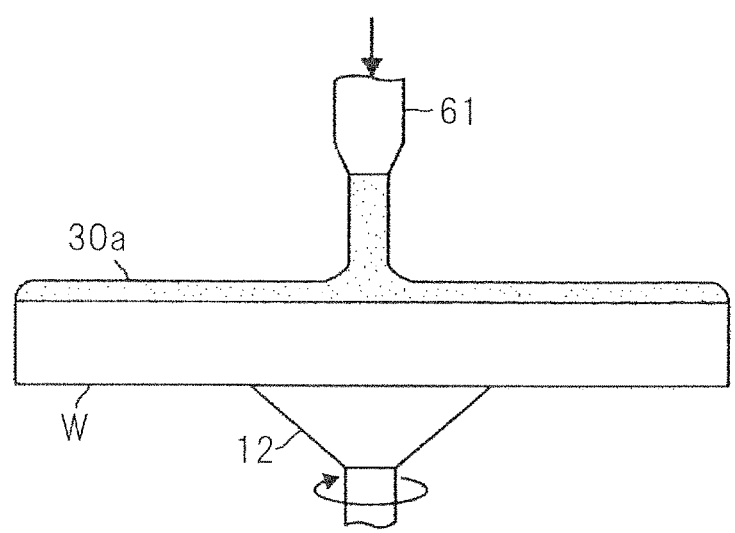
FIG. 12 is a first operation chart of the developing apparatus in the second embodiment.
Figure 13:
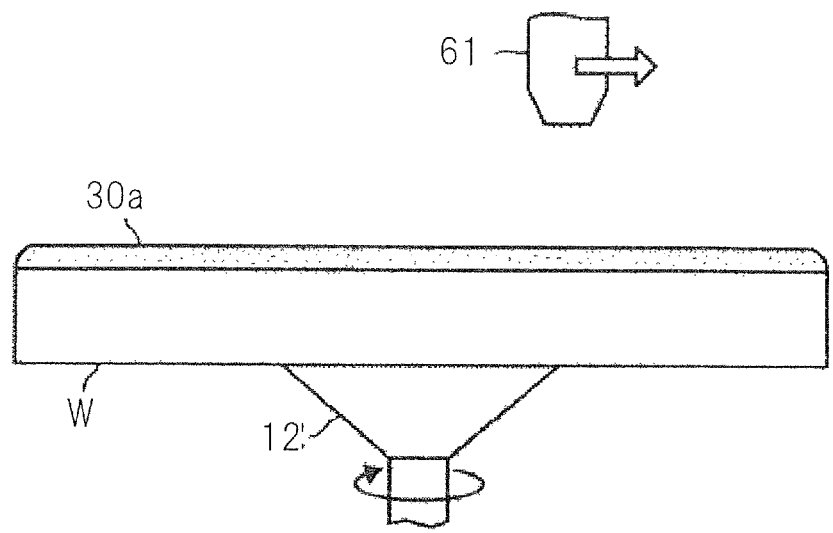
FIG. 13 is a second operation chart of the developing apparatus in the second embodiment.
Figure 14:
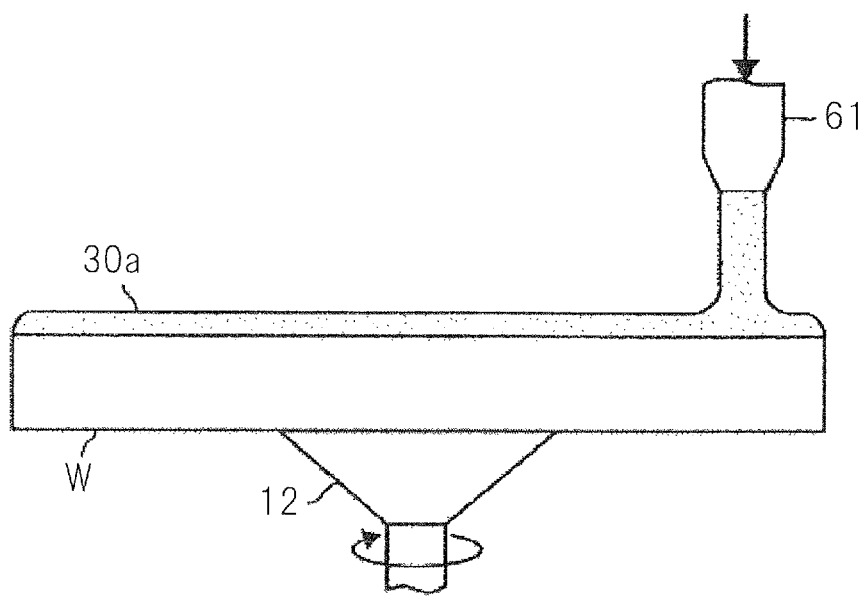
FIG. 14 is a third operation chart of the developing apparatus in the second embodiment.

Next, the developing process according to a second embodiment is described with reference to FIGS. 11 to 14. Since the developing apparatus 1 used in this developing process is the same as the developing apparatus 1 according to the first embodiment, which is described with reference to FIGS. 1 to 3, duplicative description is omitted. In FIGS. 12 to 14, the constituent elements common to those shown in FIGS. 1 to 6 are indicated by the same reference numerals.

Figure 11:
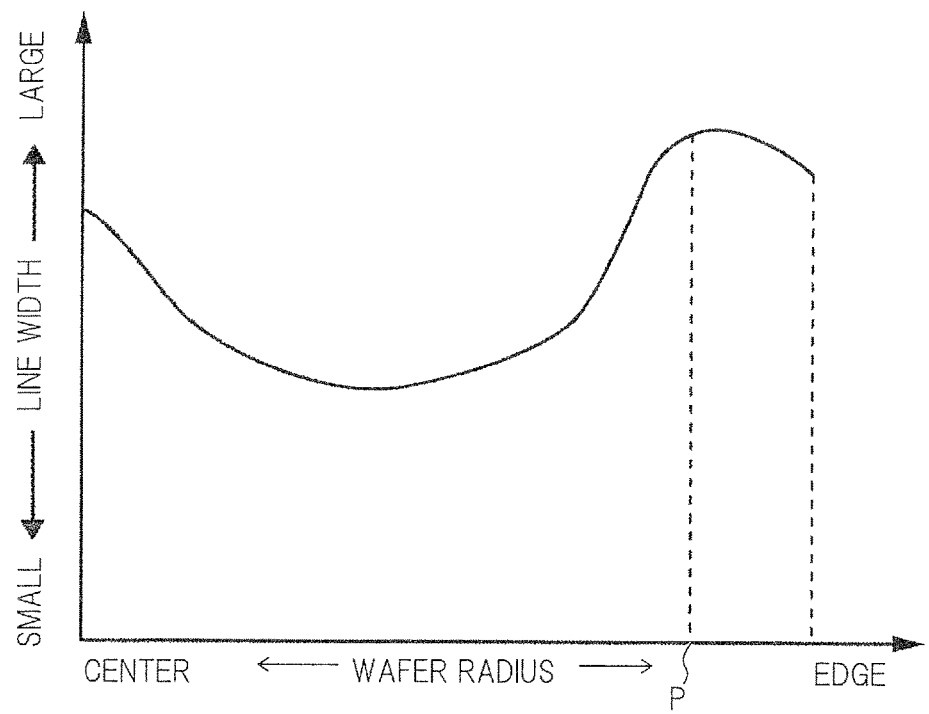
FIG. 11 is an explanatory chart showing the distribution of degree of progress of development in a developing process in a second embodiment.

FIG. 11 shows a developing process performed with the use of the main developer nozzle 3, in which the line width of LS becomes larger in two locations, i.e., the central area of the wafer W and an area near the point P in the peripheral part. Namely, there is considered a case in which a plurality of underdeveloped areas are generated locally and discontinuously. In this case, the adjustment can be more effectively performed by locally supplying the developer to the respective areas, rather than by moving the adjusting developer nozzle 61 while discharging the developer from the central area of the wafer W to the area near the point P.

Thus, for example, after the developing process by means of the main developer nozzle 3, the stationary development and the spinning-off operation of the puddle 30 containing the dissolved components, which have been described with reference to FIGS. 4 to 7, have been performed, the adjusting developer nozzle 61 is moved to a position above the underdeveloped central part of the wafer W, as shown in FIG. 12. Then, the wafer W is rotated at a rotation speed of 100 to 2000 rpm, the developer is discharged from the stopped adjusting developer nozzle 61, at a discharging rate of, e.g., 10 to 600 ml/min, so as to adjust the degree of progress of development in the central area of the wafer W.

Then, the supply of the developer from the adjusting developer nozzle 61 is stopped, while the wafer W is continuously rotated. After that, the adjusting developer nozzle 61 is moved toward a position above the point P of FIG. 11 (FIG. 13). After the adjusting developer nozzle 61 reaches the position above the point P, the developer is discharged from the adjusting developer nozzle 61 which is being stopped, so as to adjust the degree of progress of development in the area near the point P (FIG. 14).

As shown in FIG. 11, when the degree of progress of development differs between the central area of the wafer W and the area near the point P (in the example shown in FIG. 11, the area near the point P is more underdeveloped), by changing at least one of the parameters including the developer discharging rate, the rotation speed of the wafer W and the developer supplying period, the adjustment for uniformizing the degree of progress of development can be performed. As to the respective parameters, the degree of progress of development in the one area can be more accelerated as compared with the other area, by increasing the developer discharging rate, by decreasing the rotation speed of the wafer W, or by increasing the developer supplying period.

In addition, in each of the central area of the wafer W and the peripheral area near the point P, the adjusting developer nozzle 61 may be locally moved to scan each area. In this case, the parameters for adjusting the degree of progress of development further include a number of repetition of the scanning operation and a moving speed of the adjusting developer nozzle 61.

The main developer nozzle 3 used in the developing process described in the first and second embodiment is further described. The contacting part 32 of the main developer nozzle 3 has a function for stirring the developer in the puddle 30, which is formed between the wafer W and the contacting part 32, by utilizing a surface tension (see the description about FIG. 3). A nozzle having the contacting part 32 is called "pad type nozzle". The pad type nozzle may be provided with a stirring mechanism that further promotes the stirring of the developer in the puddle 30.

Figure 15:
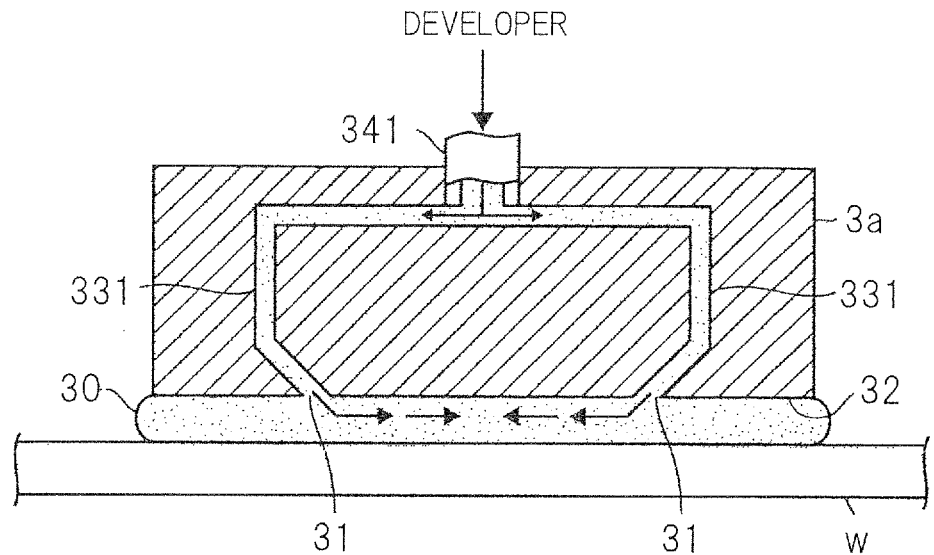
FIG. 15 shows a first configuration example of a main developer nozzle having an agitating mechanism.
Figure 16:
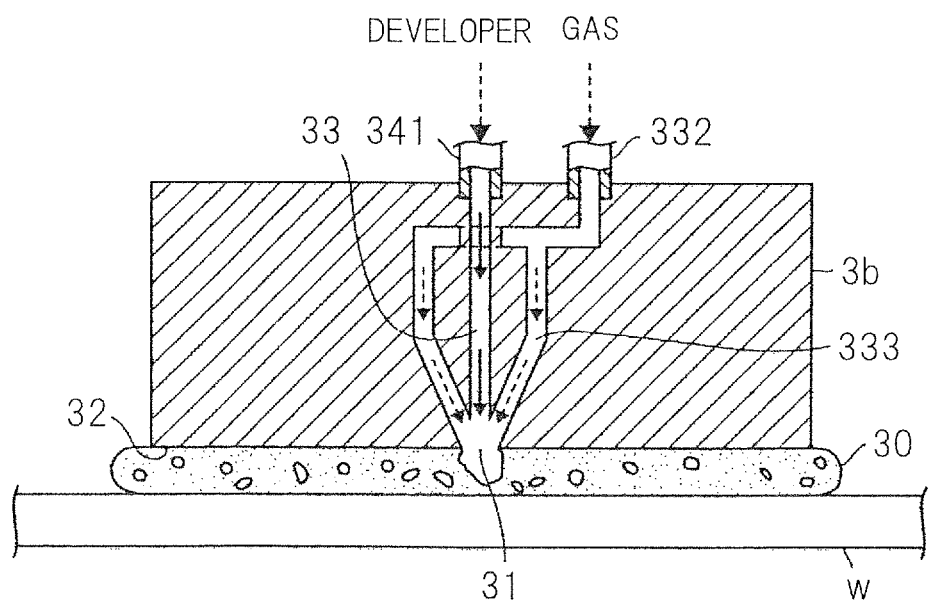
FIG. 16 shows a second configuration example of a main developer nozzle having an agitating mechanism.

A configuration example of the stirring mechanism for the developer is described below. In FIGS. 15 and 16 showing pad type nozzles 3a and 3b, the same constituent elements as those shown in FIG. 3 are indicated by the same reference numerals. The pad type nozzle having the structure shown in FIG. 3 is also referred to as "pad type nozzle 3".

The pad type nozzle 3a shown in FIG. 15 includes a plurality of branch channels 331, which are formed in a body of the pad type nozzle 3a such that the developer supplied through the straight pipe 341 branches off. In order that streams of the developer discharged from the respective discharging ports 31 merge together, the orientation of each branch channel 331 at the outlet side and the position of each discharging port 31 are determined.

When the developer is supplied by using the pad type nozzle 3a having the above structure, streams of the developer discharged from the discharging ports 31 are formed in the puddle 30 between the wafer W and the pad type nozzle 3a. As described above, since the branch channels 331 are designed such that the developer streams merge together, the developer streams collide at a merging point, so that the stirring of the puddle 30 is promoted.

The branch channels 331 may be formed such that a total cross-sectional area of the respective branch channels 331 is smaller than a cross-sectional area of the straight pipe 341 for supplying the developer to the pad type nozzle 3a. By increasing the flow speed of the developer discharged from each discharging port 31, energy of the developer streams can be increased to improve the stirring effect upon collision.

The pad type nozzle 3b shown in FIG. 16 includes a two-fluid nozzle that makes the developer to be supplied to the wafer W into droplets. A concrete configuration example of the two-fluid nozzle is described below. Similarly to the main developer nozzle 3 shown in FIG. 3, the pad type nozzle 3b includes a through-hole 33 as a liquid channel through which the developer supplied from the straight pipe 341 flows. A tubular gas channel 333, through which gas for dispersing the developer into droplets flows, is formed around the straight pipe 341. A gas supply pipe 332 for supplying gas, such as clean air, to the gas channel 333 is connected to the upstream side of the gas channel 333.

The lower area of the gas channel 333 has a conical shape tapering downward toward the center. The lower end of the gas channel 333 merges with the lower end of the through-hole 33. Since the developer and the gas are mixed violently at the merging point, the developer droplets are formed. A gas-liquid mixture flow including the droplets is discharged from the discharging port 31. The droplets in the gas-liquid mixture flow collide against the surface of the wafer W facing the discharging port 31 to be assembled together, so that a bulky puddle 30 is formed. The puddle 30 contains a lot of bubbles derived from the gas in the gas-liquid mixture flow. These bubbles pass through the puddle 30 and go outside. At this time, the stirring of the puddle 30 is promoted.

Another stirring mechanism may utilize relative movement between the pad type nozzle 3 and the wafer W, in order to promote the stirring of the puddle 30. For example, the pad type nozzle 3 is provided with an oscillator comprising a piezoelectric element or an air driven type vibrator, which vibrates the pad type nozzle 3 to promote the stirring of the puddle 30.

As another method of utilizing relative movement between the pad type nozzle 3 and the wafer W, there can be employed a method in which the wafer W is rotated by the spin chuck 12 alternately in a normal rotation direction and a reverse rotation direction so as to promote the stirring of the puddle 30. When this method is employed, it is necessary to uniformly stir the puddle 30, which is formed over the whole surface of the wafer W, as much as possible, similarly to the case in which the pad type nozzle (main developer nozzle) 3 is moved without the alternate rotation.

When the scan-out operation that moves the pad type nozzle 3 from the central part to the peripheral part is employed, the amount of rotation and the rotation speed of the wafer W in each of the normal rotation direction and the reverse rotation direction are set such that the amount of rotation of the wafer W when the pad type nozzle 3 is moved without the alternate rotation, and the net amount of rotation of the wafer W when the promotion of stirring by the alternate rotation is performed, are the same with each other per unit time. More specifically, when the ratio between the amount of rotation in the normal rotation direction and the amount of rotation in the reverse rotation direction is set 3:2, the spin chuck 12 is driven to rotate the wafer W at a rotation speed five times as fast as that in the case that does not perform the alternate rotation. Similarly, when the ratio between the amounts of rotation is set 2:1, the spin chuck 12 is driven to rotate the wafer W at a rotation speed three times as fast as that in the case that does not perform the alternate rotation.

In the respective embodiments described with reference to FIGS. 1 to 14, a nozzle having a short pipe shape is used as the adjusting developer nozzle 61 used in the adjustment of the degree of progress of development. However, the shape of the nozzle forming the adjusting developer nozzle 61 is not limited to that in those embodiments. For example, the adjustment may be performed by using the pad type nozzle 3, 3a or 3b shown in FIGS. 3, 15 and 16. Also in this case, the developer is discharged from the discharging port 31 at an adjustment position to form the puddle 30 thereat, and the developing process is performed with the contacting part contacting with the puddle 30. When the pad type nozzle 3, 3a or 3b is used as the adjusting developer nozzle 61, the main developer nozzle (first developer nozzle) 3 and the adjusting developer nozzle (second developer nozzle) 61 may be composed of the common pad type nozzle 3, 3a or 3b. As another embodiment, a nozzle having a discharging port, which extends like a slit toward the radial direction of the wafer W, may be used as the adjusting developer nozzle 61.

The developer supplied from the respective developer nozzles 3 and 61 is not limited to a developer for negative type resist film. It goes without saying that a developer for positive type resist film may be supplied depending on the type of the resist film to be developed.

In addition, the operation for the developing process by forming the puddle 30 by using the main developer nozzle 3 is not limited to a case that employs the scan-out operation in which the main developer nozzle 3 is moved from the central part to the peripheral part of the wafer W, which is described with reference to FIGS. 4 and 5. There may be employed the scan-in operation in which the main developer nozzle 3 is located on a position above the peripheral part of the wafer W, the discharging of the developer is started, and after that the main developer nozzle 3 is moved toward the central part.

Further, the order of the developing process using the main developer nozzle 3 and the developing process for adjustment using the adjusting developer nozzle 61 is not limited to the above embodiments. For example, the developing process for adjustment using the adjusting developer nozzle 61 may be performed prior to the developing process using the main developer nozzle 3. In this case, an area to be scanned and various parameters are determined based on a preliminary experiment, such that the degree of progress of development is uniform in the plane of the wafer W after the developing process for adjustment and the developing process using the main developer nozzle 3 which are performed in this order.

In addition thereto, selection of the scan-in operation or the scan-out operation for the adjustment by the adjusting develop nozzle 61, a start position and an end position of the scan-in operation or the scan-out operation, and various parameters during the supply of the developer from the adjusting developer nozzle 61 may not necessarily follow those determined by the result of the prior preliminary experiment. For example, measuring equipment may be provided inside or outside the coating and developing apparatus including the developing apparatus 1 in this embodiment. In this case, the line width of LS and the hole diameter of CH may be measured for each time when a predetermined number of wafers W are developed by using the main developer nozzle 3 and the adjusting developer nozzle 61, and the above various parameters may be changed based on the measurement result.

In this case, influence on distribution of the degree of progress of development when the various parameters are changed may be examined beforehand, and the knowledge may be reflected when conditions are set for the adjustment using the adjusting developer nozzle 61 for a succeeding wafer W to be treated, such that a desired distribution can be obtained based on the measurement result by the aforementioned measurement equipment. Namely, the succeeding wafer W may be considered to be subjected to feed-forward control in which the conditions are previously set for uniformizing distribution of the degree of progress of development.

(Third Embodiment)

Next, there is described a method for reducing difference in the degree of progress of development in a plane of the wafer W (unevenness in the degree of progress of development), when the developing process by the main developer nozzle 3 is performed by a development preparation process that supplies the developer over the whole surface of the wafer W for only a short time period and removal of developer following thereto.

As described above, generation of dissolved component produced by the developer supplied to the resist film is one of factors suppressing the progress of development by the developer. Thus, distribution of the degree of progress of development changes under the influence of concentration distribution of the dissolved components in the plane of the wafer W, the period in which the dissolved components remain, the stream of developer containing the dissolved component, and so on.

The dissolved components are mainly generated immediately after the developer contacts with the resist film. Thus, if the dissolved components generated at an initial development stage can be removed from the surface of the wafer W to reduce the dissolved components existing on the surface of the wafer W in the developing process, the difference in degree of progress of development caused by the above factor can be decreased.

Figure 26:
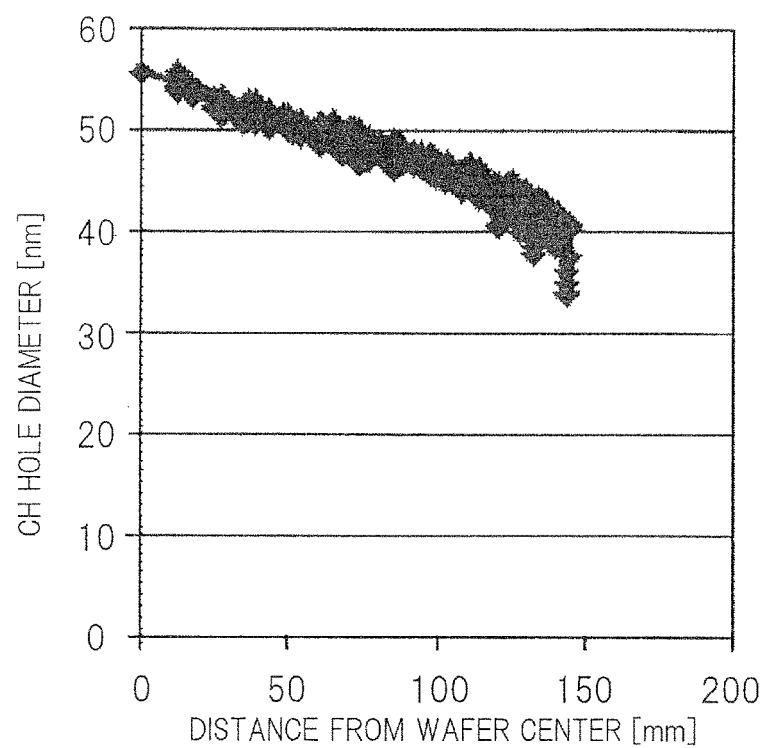
FIG. 26 is a graph showing the in-plane distribution of hole diameter in a radial direction of a wafer in the first reference example.
Figure 28:
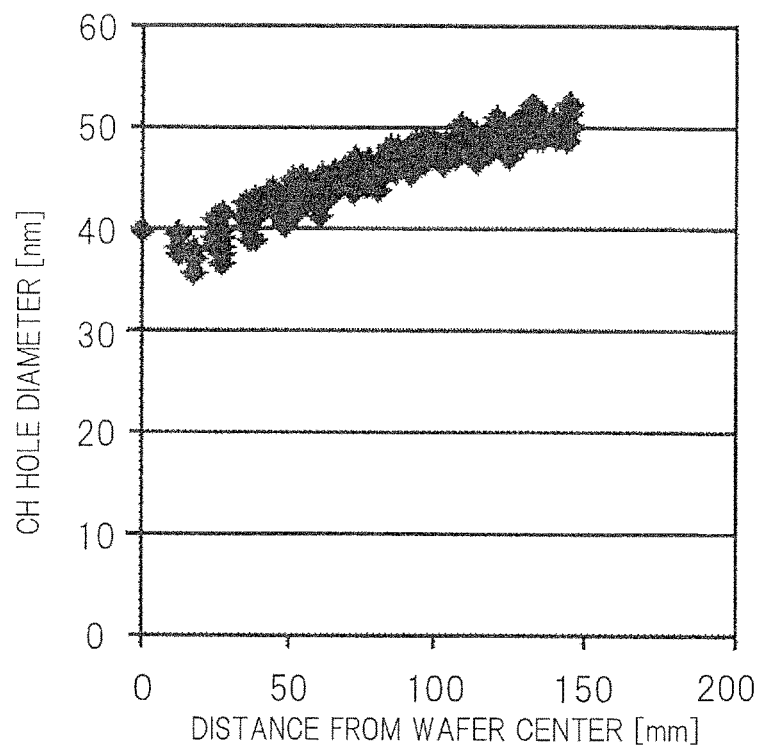
FIG. 28 is a graph showing the distribution of hole diameter in a radial direction of a wafer in the second reference example.

In addition, in a case where the main develop nozzle 3 is positioned above the wafer W to which the developer is not yet supplied, and the developing process is started, the amounts of developer and the dissolved components and the concentration of the dissolved component are considerably different between an area below the main developer nozzle 3 and an area outside the area below the main developer nozzle 3. In addition, as described above, the dissolved components are mainly generated at an initial development stage. Thus, at the time when the main developer nozzle 3 is moved to a certain area and the developing process is started in that area, the concentration of the dissolved components (previously generated) contained in the puddle 30 below the main developer nozzle 3 at the starting of the development process at the certain area and the concentration of the dissolved components newly generated at the certain area may be different from those in the other areas. Thus, there is a possibility that the developing result at the certain area differs from that of other areas. As a result, as shown in FIGS. 26 and 28, there is formed a distribution having different degree of progress of development in the radial direction of the wafer W (impact effect), along the moving direction (trajectory) of the main developer nozzle 3.

On the contrary, by removing the dissolved components, which have been generated at an initial development stage, from the surface of the wafer W, the difference in developing conditions (difference in the dissolved component concentrations), which differs before and after the movement of the main developer nozzle 3 to each area, can be reduced.

Figure 31:
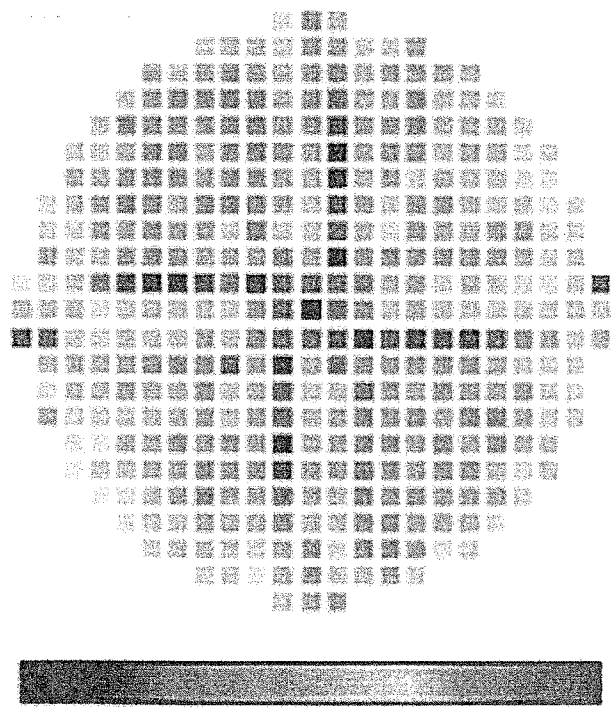
FIG. 31 is a diagram showing the in-plane distribution of hole diameter of CH after a developing process in a fourth reference example.

On the other hand, as described above, it is necessary to consider that, when the developer supply period in the conventional method without using the main developer nozzle 3 is prolonged, there are formed some sparsely radiating areas in which the degree of progress of development are different from the other areas (FIG. 31). Moreover, when the dissolved components remain on the surface of the wafer W, the dissolved components suppress the sufficient development of the resist film to invite development failure.

Thus, this embodiment performs the development preparation for generating the dissolved components, in which the developer is supplied from, e.g., a conventional developer nozzle (hereinafter referred to as "developer nozzle 61" in the third embodiment) to the wafer W rotated at a rotation speed within a range between 100 and 2000 rpm, for only a short period such as 1 to 5 seconds, at a supply (discharge) rate of the developer ensuring that separation of liquid film of the developer in the circumferential direction of the wafer W does not occur. After the supply of the developer, the wafer W is continuously rotated to remove the developer. Thus, the dissolved components generated at the initial stage are removes, and the developing process by the main developer nozzle 3 can be started under the condition where development defects are unlikely to occur.

The supply of the developer by the developer nozzle (second developer nozzle) 61 corresponds to the developer supplying step, in particular, the development preparation step that makes preparation for the developing process by the main developer nozzle (first developer nozzle) 3 (developer spreading step).

Herebelow, there is described an embodiment of the method of developing a wafer W by using the main developer nozzle 3, after the development preparation, with reference to FIGS. 17 to 24. In FIGS. 17 to 24, the same constituent elements as those shown in FIGS. 1 to 6 are indicated by the same reference numerals.

Figure 17:
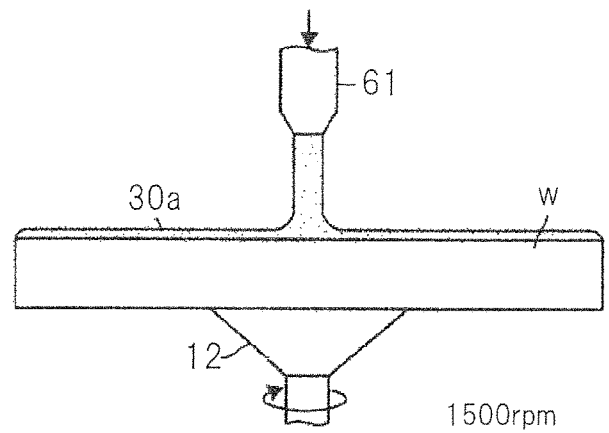
FIG. 17 is a first operation chart of the developing apparatus in a third embodiment.

A wafer W is firstly caused to be held by the spin chuck 13. Then, the wafer W is rotated at a rotation speed within a range between 100 to 2000 rpm, e.g., at a rotation speed of 1500 rpm, and the developer nozzle 61 is moved to a position above the central part of the wafer W. Thereafter, there is performed the development preparation in which the developer is supplied from the developer nozzle 61, at a flow rate of 60 ml/sec by which a liquid film 30a can be formed without liquid-film discontinuity in the circumferential direction of the wafer W, for only a short period within a range between 1 and 5 seconds, e.g., 1 second (FIG. 17). Regarding the supply rate of the developer, it is not absolutely necessary that the liquid film 30a covers the whole surface of the wafer W at a certain time point, as long as there is no liquid-film discontinuity in the circumferential direction of the wafer W. The supply (flow) rate of the developer may be such that annular (ring-shaped) liquid film 30a spreads on the surface of the wafer W.

Also in the development preparation, the resist film in contact with the developer is developed, along with the generation of the dissolved component. However, since the contacting period is short as described above, the progress of development can be restrained such that it does not go beyond the initial stage. Thus, the level of formation of radial areas having different degrees of progress of development, which has been problematic in the conventional art, is not problematic.

Figure 18:
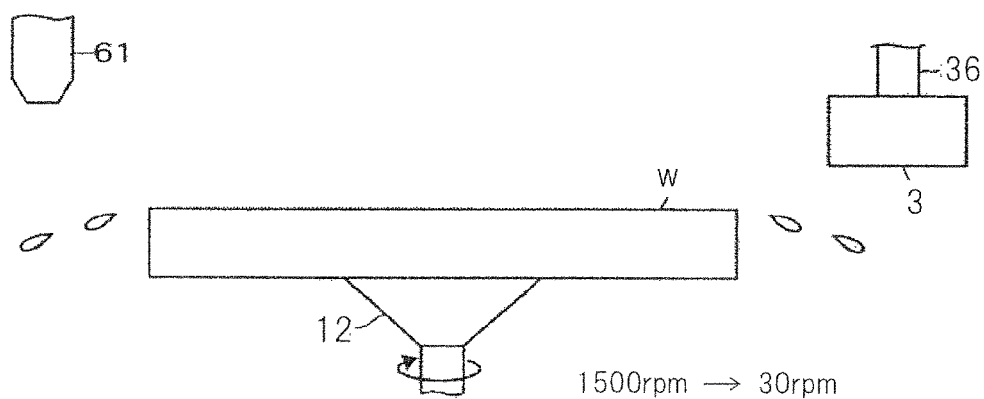
FIG. 18 is a second operation chart of the developing apparatus in the third embodiment.

After the developer has been supplied for a preset period, the supply of the developer from the developer nozzle 61 is stopped, and the rotation speed of the wafer W is decreased from 1500 rpm to 30 rpm (FIG. 18). When the supply of the developer is stopped, the developer containing relatively a large amount of dissolved components, which have been generated at the initial development stage, is removed from the surface of the rotating wafer W during the deceleration. During the removal, the developer nozzle 61 is retracted from above the wafer W, and the main developer nozzle 3 is moved to a position above the peripheral part of the wafer W.

Figure 19:
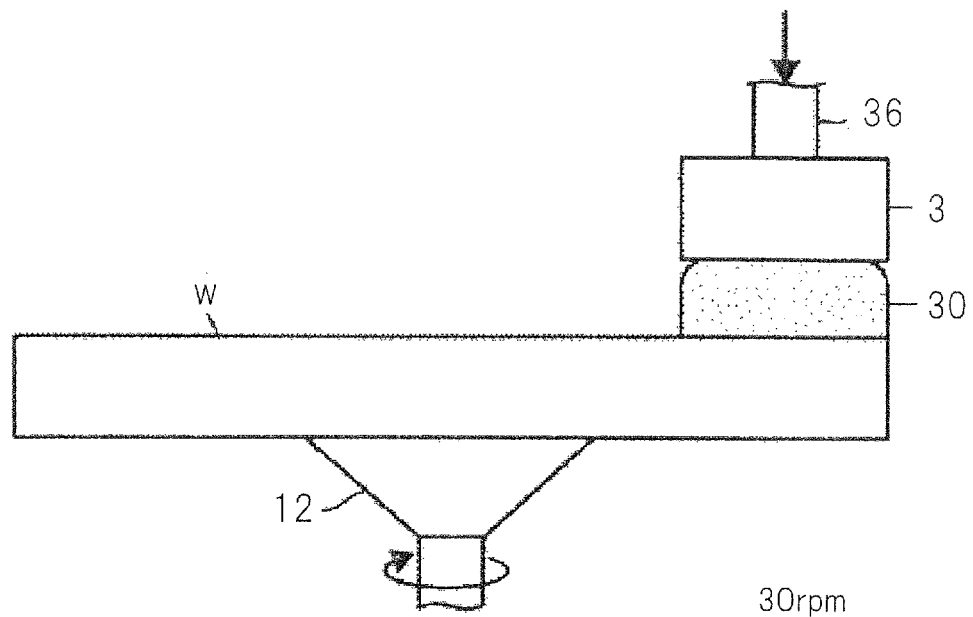
FIG. 19 is a third operation chart of the developing apparatus in the third embodiment.

When the rotation speed reaches 30 rpm, the developer containing the dissolved component is almost removed from the surface of the wafer W, but the surface of the wafer W is still wetted with the developer. Under this condition, the main developer nozzle 3, which has been moved to the position above the peripheral part of the wafer W, is lowered to a height position at which the developer is supplied. Then, the developer is supplied from the discharging port 31 to form the puddle 30 of the developer between the nozzle and the wafer W (FIG. 19). The supply rate of the developer is adjusted to a value within a range between 60 and 600 ml/min, for example.

Figure 20:
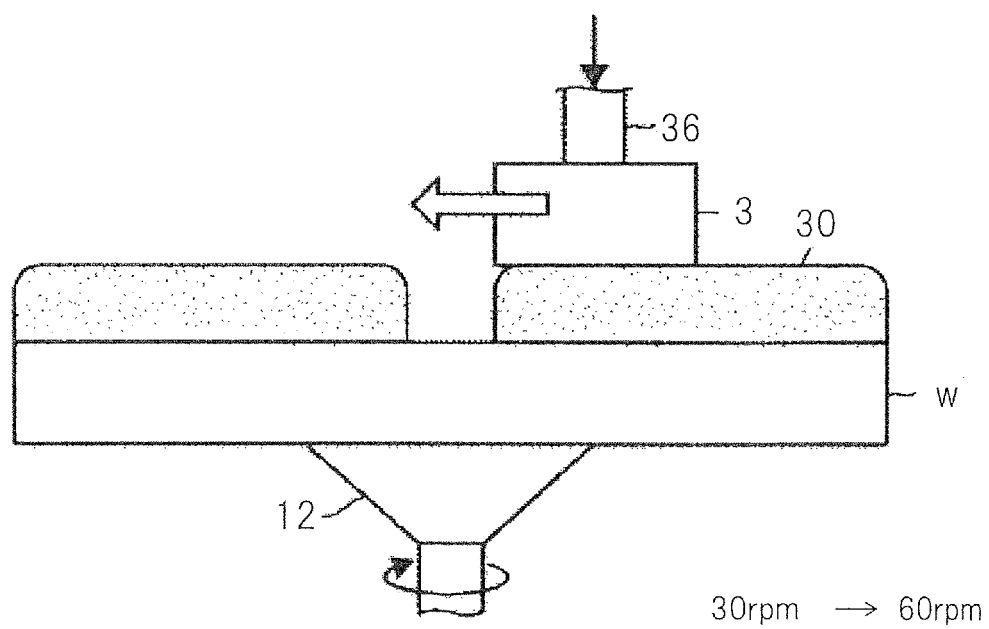
FIG. 20 is a fourth operation chart of the developing apparatus in the third embodiment.

After that, while the main developer nozzle 3 is moved from the peripheral part to the central part of the wafer W at a moving speed within a range between 10 and 100 mm/sec, e.g., 22 mm/sec, the rotation speed of the wafer W is increased from 30 rpm to 60 rpm so as to spread the puddle 30 of the developer on the wafer W (FIG. 20). Namely, in this embodiment, the puddle 30 is spread on the wafer W by the scan-in operation. Although the developing process is performed after the development preparation which has been performed prior thereto, the developer in the puddle 30 contains the dissolved component, along with the progress of development by the developer supplied from the main developer nozzle 3.

Under this condition, when the puddle 30 is spread by the scan-out operation, the developer containing the dissolved components may flow out from the puddle 30 ahead of the position of the main developer nozzle 3. As a result, even when the main developer 3 formed of a pad type nozzle is used, there is a possibility that the progress of development by the new developer is suppressed by the dissolved component. If the influence of the developer flowing out from the puddle 30 is serious, the puddle 30 may be spread by the scan-in operation, with the wafer W being rotated. In this case, by utilizing the centrifugal force acting on the puddle 30, it is possible to suppress the developer containing the dissolved component to flow ahead of the main developer nozzle 3. If the influence of the developer flowing out from the puddle 30 is not so serious, it goes without saying that the puddle 30 can be spread by the scan-out operation, similarly to the example described with reference to FIGS. 4 to 6.

Figure 21:
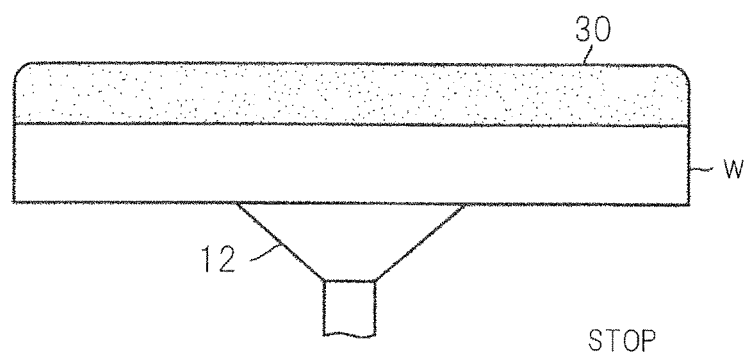
FIG. 21 is a fifth operation chart of the developing apparatus in the third embodiment.

After the whole surface of the wafer W has been covered with the puddle 30 of the developer supplied from the main developer nozzle 3, the rotation of the wafer W is stopped. Then, the stationary development is performed for a period by which the development is sufficiently accelerated, e.g., for 20 seconds (FIG. 21).

Figure 22:
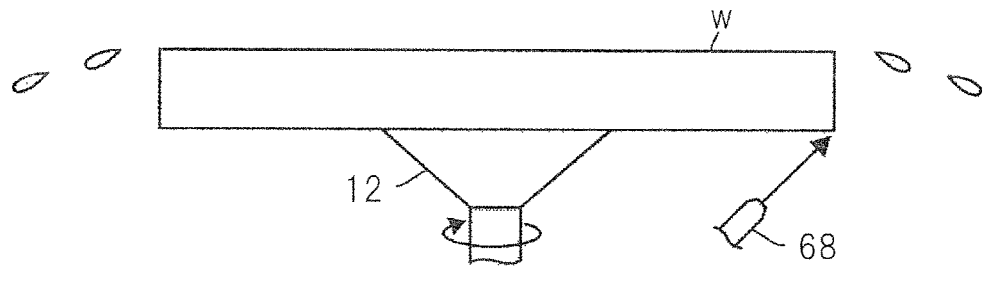
FIG. 22 is a sixth operation chart of the developing apparatus in the third embodiment.
Figure 23:
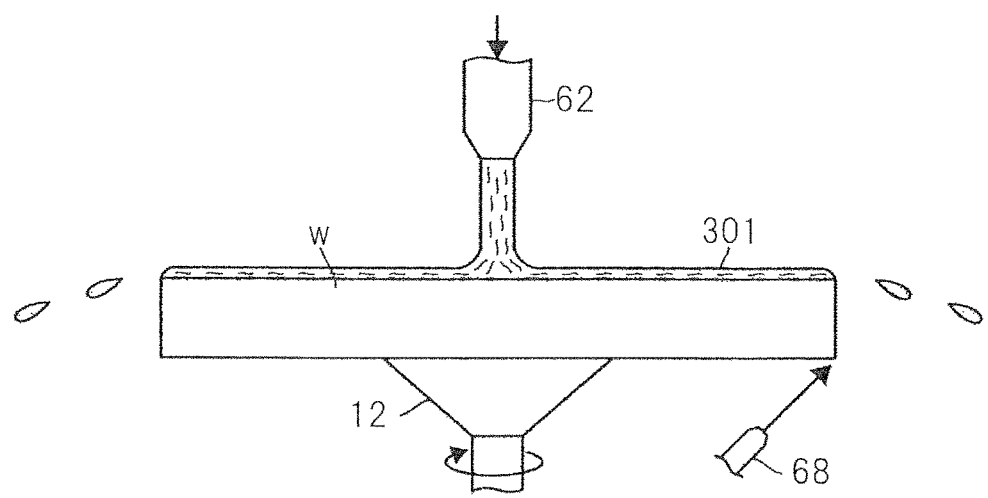
FIG. 23 is a seventh operation chart of the developing apparatus in the third embodiment.
Figure 24:
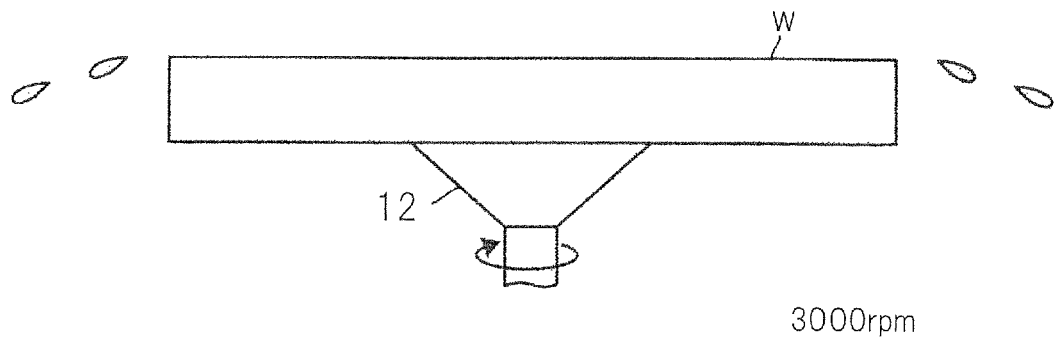
FIG. 24 is an eighth operation chart of the developing apparatus in the third embodiment.

Thereafter, the wafer W is rotated at a rotation speed of, e.g., 1000 rpm, to spin out the puddle 30, and the peripheral area of the rear surface of the wafer W is cleaned by using a back surface cleaning nozzle 68 located beside the spin chuck 12 (FIG. 22).

Further, the cleaning liquid nozzle 62 is moved to a position above the central part of the wafer W. At a time when the puddle 30 on the wafer W is spun out, the rotation speed of the wafer W is increased to about 2000 rpm. Then, the cleaning liquid is supplied from the cleaning liquid nozzle 62, and the cleaning liquid 301 is spread over the whole surface of the wafer W so as to perform the cleaning process that removes the developer remaining on the surface of the wafer W.

After the the cleaning process has been performed for a preset period, the supply of the cleaning liquid from the cleaning liquid nozzle 62 is stopped. The rotational speed of the wafer W is increased up to 3000 rpm, so as to dry the wafer W by spinning. After the wafer W has been dried, the rotation of the wafer W is stopped, and the developed wafer W is unloaded.

According to the developing process in the third embodiment, due to the development preparation and the succeeding removal of developer that are performed beforehand, the developing process can be performed under the condition where the dissolved component mainly generated at the initial development stage has been removed. As a result, the concentration of the dissolved component in the puddle 30, which is to be spread by the main developer nozzle 3, is low, as well as the developing process is performed uniformly in the plane of the wafer W. Thus, the distribution of the degree of progress of development can be uniformized, while reducing unevenness in the degree of progress of development.

The nozzle for supplying the development for development preparation (second developer nozzle) is not limited to the developer nozzle 61 having a short-pipe shape. The development preparation can be performed by using the aforementioned pad type nozzle 3, 3a or 3b. In this case, the pad type nozzle 3, 3a or 3b is located at a position above the central part of the wafer W, and the developer is supplied from the discharging port 31 for the above-described period. The puddle 30 may be formed between the pad type nozzle 3, 3a or 3b and the wafer W, but need not be formed between the pad type nozzle 3, 3a or 3b and the wafer W.

When the developer nozzle 61 is constituted by using a pad type nozzle (3, 3a or 3b), the main developer nozzle (first developer nozzle) 3 and the developer nozzle (second developer nozzle) 61 may be composed of a common pad type nozzle (3, 3a or 3b), which is similar to the first and second embodiments. It goes without saying that the pad type nozzle 3, 3a or 3b may be vibrated and/or the wafer W may be rotated alternately in the normal rotation direction and the reverse rotation direction, so as to promote stirring.

In the above respective developing process according to the first to third embodiments, the method of removing the puddle 30 containing the dissolved component from the wafer W is not limited to the spin-off method by the rotation of the wafer W shown in FIGS. 7 and 22. For example, the puddle 30 may be eliminated by using a tubular hose for sucking the developer, or the puddle 30 on the surface of the wafer W may be swept away by means of a spatula.

EXAMPLES

Preliminary Experiment

A wafer W developing process was performed using the main developer nozzle 3 shown in FIGS. 1 to 3, and the distribution of degree of progress of development was observed. In addition, the distribution of degree of progress of development was observed in a developing process using a conventional nozzle having a short-pipe shape.

A. Experiment Condition

Reference Example 1

The main developer nozzle 3 of 40 mm diameter was used. A scan-out operation was used in which the discharging of the developer is started at the central part of a wafer of 300 mm diameter and then the main developer nozzle 3 was moved to the peripheral part, whereby a puddle 30 was formed on the whole surface of the wafer W to perform development. In the period during which the developer was being supplied, the wafer rotation speed was 30 rpm, the developer discharging rate was 60 nil/min, and the moving speed of the developer nozzle 3 was 20 mm/sec.

Reference Example 2

A developing process is performed by forming a puddle 30 using a scan-in operation in which the main developer nozzle 3 was moved from the peripheral part to the central part, while the other experiment conditions were the same as those of the reference example 1.

Reference Example 3

After a wafer W was subjected to a developing process using the scan-out operation under the same conditions as those of the reference example 1, the wafer W was subjected to a second developing process using the scan-in operation under the same conditions as those of the reference example 2.

Reference Example 4

A developer nozzle having a short-pipe shape was used. A developing process is performed by starting discharging of the developer at the central part of a wafer of 300 mm diameter and then the main developer nozzle was moved to the peripheral part. In the period during which the developer was being supplied, the wafer rotation speed was 100 rpm, the developer discharging rate was 20 ml/min, and the moving speed of the developer nozzle was 20 mm/sec.

B. Experiment Result

Figure 25:
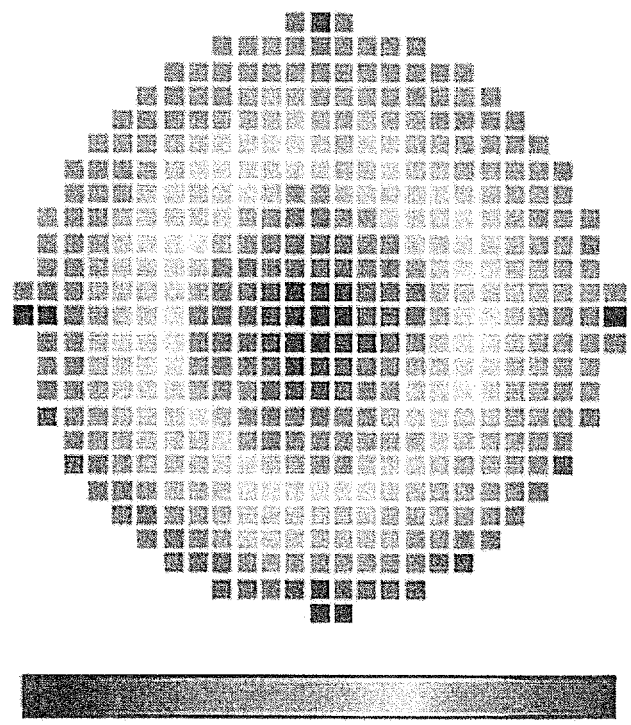
FIG. 25 is a diagram showing the in-plane distribution of hole diameter of CH after a developing process in a first reference example.
Figure 27:
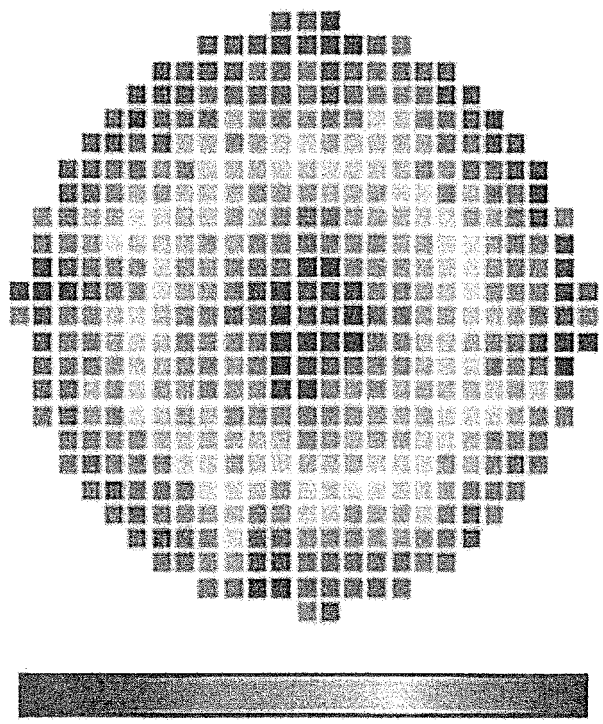
FIG. 27 is a diagram showing the in-plane distribution of hole diameter of CH after a developing process in a second reference example.
Figure 29:
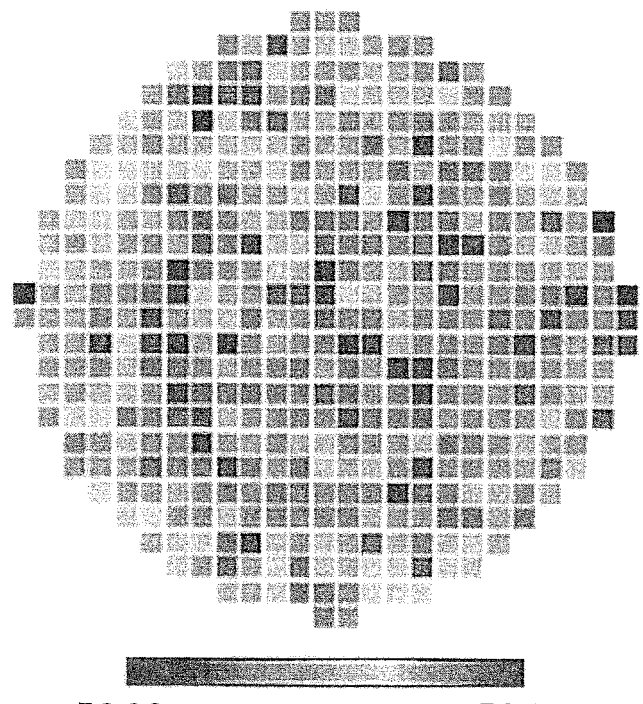
FIG. 29 is a diagram showing the in-plane distribution of hole diameter of CH after a developing process in a third reference example.
Figure 30:
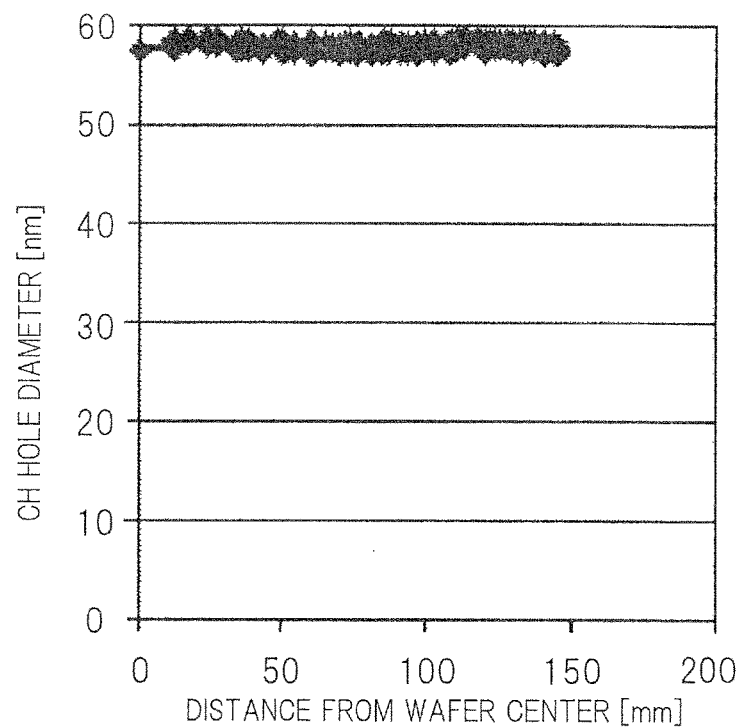
FIG. 30 is a graph showing the distribution of hole diameter in a radial direction of a wafer in the third reference example.

The experiment result for reference example 1 is shown in FIGS. 25 and 26; the experiment result for reference example 2 is shown in FIGS. 27 and 28; the experiment result for reference example 3 is shown in FIGS. 29 and 30; and the experiment result for reference example 4 is shown in FIG. 31. Each of FIGS. 25, 27, 29 and 31 shows the in-plane distribution of hole diameter of CH (Contact Holes), which were made by exposing the resist film on the wafer with a CH pattern including a plurality of holes of the same diameter, and by developing the resist film. In the actual diagram, the hole diameter is distinguished by colors assigned to respective hole diameter ranges. Due to restriction of indication on the drawings, the hole diameter distribution is indicated by monochromatic image. Each of FIGS. 26, 28 and 30 shows the distribution of hole diameter in a radial direction of a wafer. In these figures, the horizontal axis indicates the distance from the center of the wafer W, the vertical axis indicates the hole diameter of CH.

As shown in Hg. 26, in reference example 1 in which the developing process was performed by using the scan-out operation, the degree of progress of the development was larger at the central part of the wafer W, in which the hole diameter of CH was large. On the other hand, the degree of progress of the development was smaller at the peripheral part, in which the hole diameter of CH was small. As shown in FIG. 25, it can be understood that the hole diameter distribution was substantially rotational symmetrical. In view of the above, it can be understood that if the developing process was performed by using the scan-out operation, the distribution of degree of progress of development over the wafer W has a shape of a reverse cup.

As shown in FIG. 28, in reference example 2 in which the developing process was performed by using the scan-in operation, the degree of progress of the development was larger at the peripheral part of the wafer W, in which the hole diameter of CH was large. On the other hand, the degree of progress of the development was smaller at the central part, in which the hole diameter of CH was small. As shown in FIG. 27, it can be understood that the hole diameter distribution was substantially rotational symmetrical. In view of the above, it can be understood that if the developing process was performed by using the scan-in operation, the distribution of degree of progress of development over the wafer W has a shape of a cup.

As shown in FIG. 30, in reference example 3 in which a developing process is performed twice, combining the scan-out operation and the scan-in operation, the distribution of degree of progress of development was eliminated, and a uniform hole diameter distribution was established. As shown in FIG. 29, no specific symmetrical pattern was found. In view of the above, it was confirmed that, even if a distribution of degree of progress of development that varies along the radial direction of the wafer is established, a correction for uniformizing the distribution of degree of progress of development can be performed by supplying the developer such that the distribution can is cancelled.

On the contrary, in the result of the experiment using a conventional developer nozzle having a short-pipe shape as shown in FIG. 31, there were some areas, in which the degree of progress of development are different from the other areas, sparsely radiating from the central part to the peripheral part of the wafer W. It was also confirmed that, if a similar developing process was performed with a higher wafer rotation speed up to 1000 rpm, the difference of the degree of progress of development between the radial areas having the different degree of progress of development became larger. In a case where the degree of progress of development is uneven with respect to the circumferential direction of the wafer W, it is difficult to uniformize the distribution of degree of progress of development even if the wafer W is rotated and the developer is supplied to the wafer W again.

In view of the above results, it can be said that the adjustment (correction) operation, which supplies a developer again to a wafer W having been developed once to uniformize the distribution of degree of progress of development, is specifically effective in a case where a developing process is performed using the main developer nozzle 3 having the contacting part disposed to face the surface of the wafer W.

Experiment 1

A developing process of LS (Line and Space) and a subsequent adjustment process were performed using the method having been described with reference to FIGS. 4 to 8. The line width distribution of the LS was measured after each process.
A. Experiment Condition Example 1

The main developer nozzle 3 of 40 mm diameter was used. A scan-out operation was used in which the discharging of the developer is started at the central part of a wafer of 300 mm diameter and then the main developer nozzle 3 was moved to the peripheral part, whereby a puddle 30 was formed on the whole surface of the wafer W to perform development. In the period during which the developer was being supplied, the wafer rotation speed 30 rpm, the developer discharging rate was 60 ml/min, and the moving speed of the developer nozzle 3 was 20 mm/sec.

Figure 32:
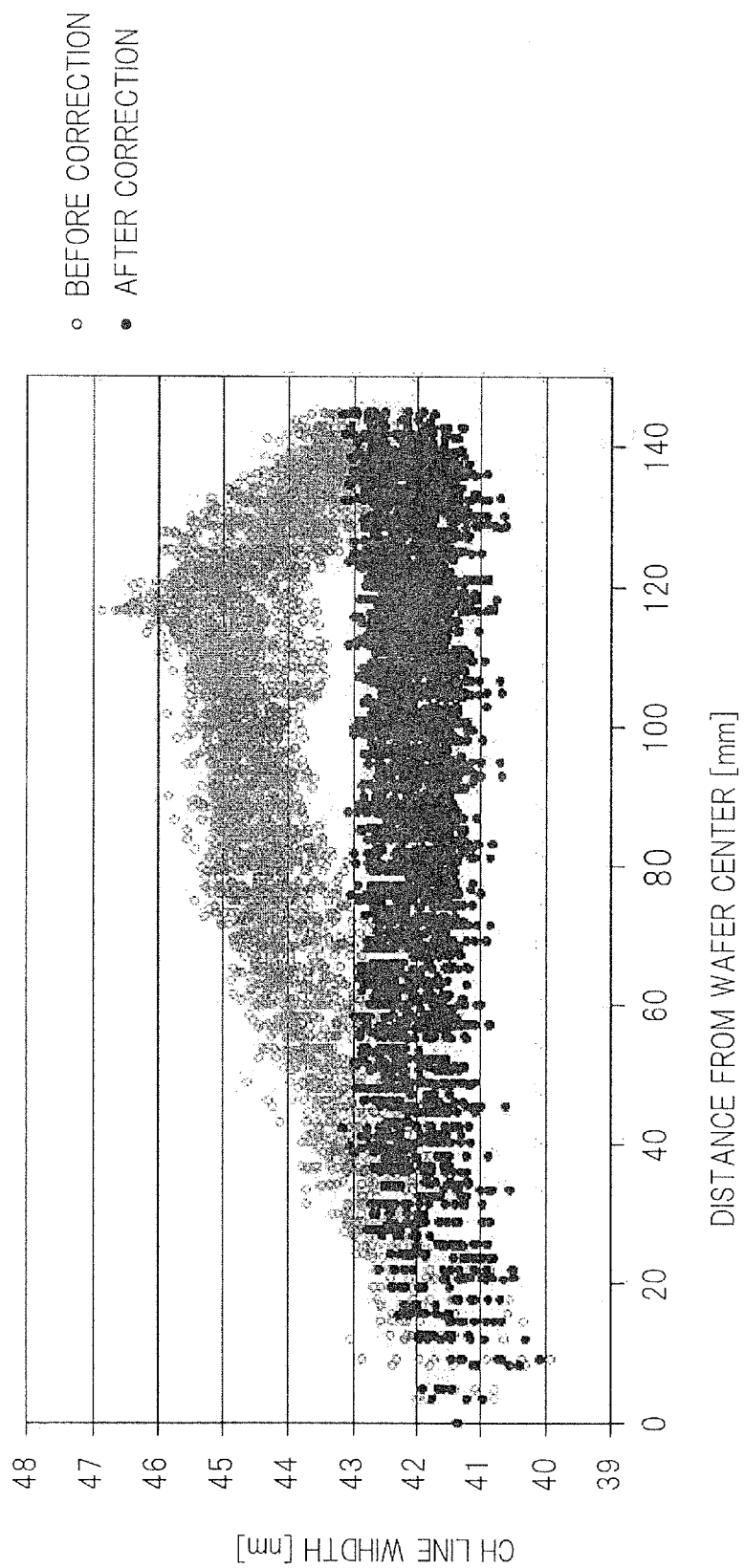
FIG. 32 is a graph showing the distribution of LS before and after correction in one example.

Next, the adjustment process of degree of progress of development was performed by supplying the developer to an area extending from a position radially inside by 5 mm from the edge of the wafer W to a position radially inside by 20 mm from the edge of the wafer W, using the scan-in operation. During the adjustment process, the wafer rotation speed was 100 rpm, the developer discharging rate was 20 ml/min, and the moving speed of the developer nozzle 3 was 20 mm/sec.
B. Experiment Result FIG. 32 shows the experiment result for example 1. In FIG. 32, the horizontal axis indicates the radial distance [mm] from the center of the wafer W, the vertical axis indicates the line width [nm] of the LS. Gray plots indicates the line width of the LS before the correction (adjustment) using the developer nozzle 61, and black plots indicates the line width of the LS after the correction (adjustment) using the developer nozzle 61.

As shown in FIG. 32 showing the experiment result, after the development using the main developer nozzle 3, a distribution, in which the line width of the LS was thicker and thus the degree of progress of development was small in the peripheral portion of the wafer W, was observed. A uniform distribution of the line width of the LS with respect to the radial direction was achieved, by supplying the adjusting developer nozzle 61 thereby adjusting the degree of progress of development. From this result, it was confirmed that, even in a case where the developing process using the main developer nozzle 3 formed a distribution in which the degree of progress of development varies along the radial direction, an adjustment that uniformize the degree of progress of development can be performed by supplying a developer by the adjusting developer nozzle 61 so as to cancel the distribution.

Experiment 2

A development preparation process and a developing process of the LS were performed using the method according to the third embodiment.
A. Experiment Condition Example 2-1

A wafer of 300 mm diameter was developed using the main developer nozzle 3 of 40 mm diameter using the scan-in operation in which the nozzle moving speed was 10 mm/sec. The other experiment conditions were the same as those in the example having been described with reference to FIGS. 17 to 24.

Example 2-2

The scan-in of the main developer nozzle 3 started with the nozzle moving speed of 20 mm/sec, and thereafter the nozzle moving speed was gradually reduced such that the nozzle moving speed was reduced to 10 mm/sec at the position distant from the center of the wafer W by 75 mm, and thereafter the nozzle moving speed was maintained at 10 mm/sec. The other experiment conditions for the developing process were the same as example 2-1.

Example 2-3

The scan-in of the main developer nozzle 3 started with the nozzle moving speed of 5 mm/sec, and thereafter the nozzle moving speed was gradually increased such that the nozzle moving speed was reduced to 10 mm/sec at the position distant from the center of the wafer W by 75 mm, and thereafter the nozzle moving speed was maintained at 10 mm/sec. The other experiment conditions for the developing process were the same as example 2-1.

B. Experiment Result

Figure 33:
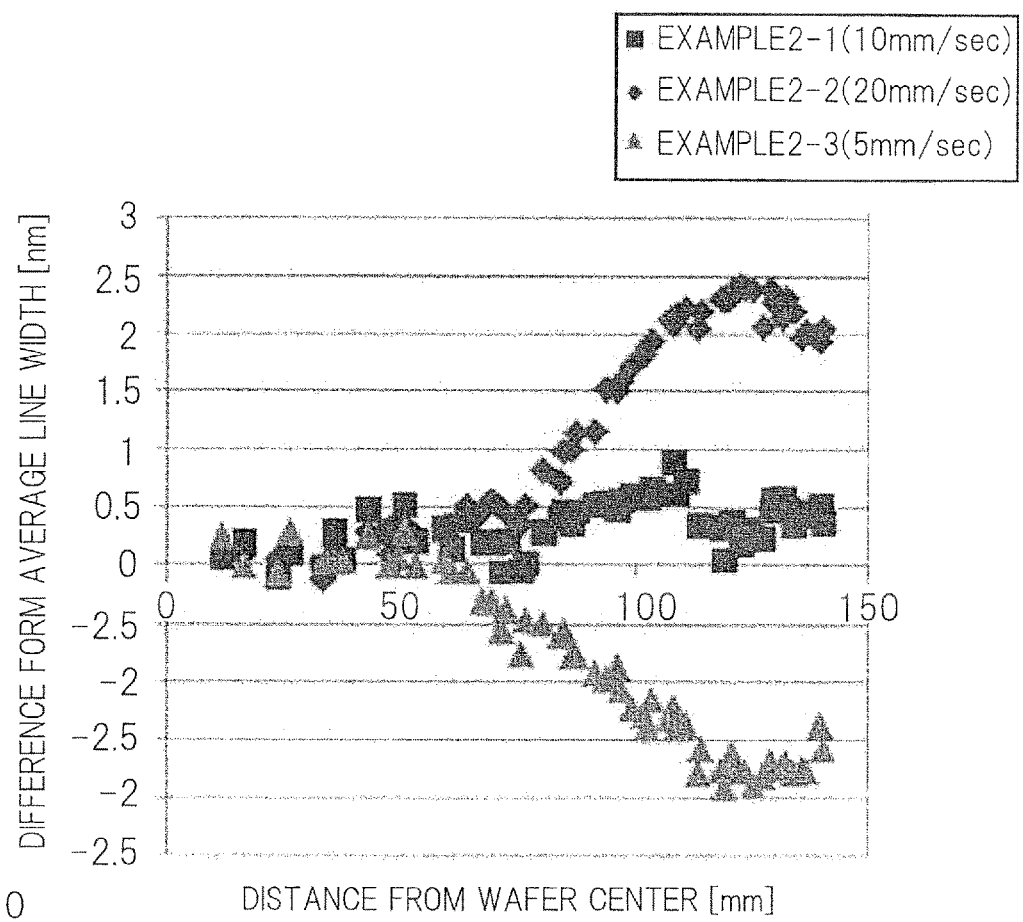
FIG. 33 is a graph showing the distribution of LS in an example in which a development preparation and a development using a main developer nozzle are combined.

The experiment results for examples 2-1 to 2-3 are shown in FIG. 33. In FIG. 33, the horizontal axis indicates the radial distance [mm] from the center of the wafer W, the vertical axis indicates the difference that was obtained by subtracting the measured value of the line width [nm] of the LS in each positions from the average of the measured values, in each of examples 2-1 to 2-3. In FIG. 33, square plots indicate the experiment data for example 2-1, rhombic plots indicate the experiment data for example 2-2, and triangular plots indicate the experiment data for example 2-3.

According to the result for example 2-1 shown in FIG. 33, when the developing process using the main developer nozzle 3 was performed after performing the development preparation process and then the removal of the developer, the variation of the line width was suppressed within the range from about 0 nm to +1 nm. The result of example 2-1 can be evaluated that it could achieve a substantially uniform distribution of degree of progress of development with respect to the radial direction, as compared with the reference examples 1 and 2 as shown in FIGS. 26 and 28. As shown in the experiment results of examples 2-2 and 2-3, it was found that a higher nozzle moving speed resulted in delay of the progress of the development and thicker line width (the peripheral part of the wafer in example 2-2), while a lower nozzle moving speed resulted in acceleration of the progress of the development and thinner line width (the peripheral part of the wafer in example 2-2).

The experiment results for the examples 2-2 and 2-3 indicate that, even in a case where the development preparation process is performed, the speed of progress of development can be adjusted by changing the moving speed of the main developer nozzle 3 (the moving speed can be interpreted to correspond to the amount of the developer supplied to each area of the wafer surface per unit time). It was also confirmed that the experiment result of example 2-1 can be improved using this knowledge.

What is claimed is:

1. A developing method comprising:
    causing an exposed substrate to be held by a rotatable, substrate holding unit;
    a developer spreading step including:
        a step of forming a puddle of a developer on a surface of the substrate held by the substrate holding unit, by discharging the developer from a discharging port of a first developer nozzle, the first developer nozzle comprising a nozzle having a contacting part arranged to face the surface of the substrate, the contacting part being smaller than the surface of the substrate; and
        a step of subsequently spreading the puddle of the developer over the whole surface of the substrate, by moving the first developer nozzle discharging the developer from one of a central part and a peripheral part to the other of the central part and the peripheral part of the rotating substrate, with the contacting part contacting with the puddle;
    a developer supplying step that supplies the developer from a second developer nozzle onto the surface of the substrate with the substrate being rotated, thereby to uniformize, in a plane of the substrate, distribution of a degree of progress of development by the developer spreading step, wherein the developer supplying step is a development adjusting step that supplies the developer to an underdeveloped area as compared with other areas, thereby to accelerate development in the underdeveloped area; and
    a developer removing step that is performed between the developer spreading step and the developer supplying step to remove the developer on the surface of the substrate.

2. The developing method according to claim 1, wherein the developer spreading step is performed prior to the development adjusting step.

3. The developing method according to claim 1, wherein the step of spreading the puddle of the developer moves the first developer nozzle from the central part to the peripheral part of the rotating substrate, and wherein the development adjusting step comprises a step of discharging the developer from the second developer nozzle while moving a supply position of the developer from one of the central part and the peripheral part to the other of the central part and the peripheral part of the substrate.

4. The developing method according to claim 1, wherein the development adjusting step comprises a step of discharging the developer from the second developer nozzle locally to a radial position on the substrate.

5. The developing method according to claim 4, wherein the step of discharging the developer locally is performed with the second developer nozzle being stopped.

6. The developing method according to claim 4, wherein in the development adjusting step, a plurality of radial positions, to which the second developer nozzle discharges the developer, are set on the substrate, and wherein the radial positions are separated from each other with respect to a radial direction of the substrate.

7. The developing method according to claim 6, wherein the step of discharging the developer locally is performed with the second developer nozzle being stopped, and wherein at least one of a developer discharging rate, a number of revolution of the substrate per unit time and a developer supplying period from the second developer nozzle at one of the plurality of radial positions is different from that at another one of the plurality of radial positions.

8. The developing method according to claim 1, wherein the developer supplying step is a development preparation step that supplies the developer to form a liquid film on the surface of the substrate so as to make preparation for the developer spreading step.

9. The developing method according to claim 8, wherein the first developer nozzle moves from the central part to the peripheral part of the substrate in the step of spreading the puddle of the developer.

10. The developing method according to claim 1, wherein the second developer nozzle is composed of the nozzle having the contacting part.

11. The developing method according to claim 10, wherein the first developer nozzle and the second nozzle are composed of a common nozzle.

12. The developing method according to claim 1, wherein the developer removing step is a step of rotating the substrate thereby spinning off the developer from the substrate.

13. A non-transient computer-readable storage medium storing computer program, which is to be used in the developing apparatus, which performs a developing process by supplying a developer onto a surface of the substrate, on which an exposed resist film is provided, wherein the computer program includes steps for performing the developing method according to claim 1.

14. A developing apparatus comprising:
    a rotatable, substrate holding unit that holds an exposed substrate horizontally;
    a first developer nozzle that comprises a nozzle having a contacting part and a developer discharge port, the contacting part being arranged to face the surface of the substrate and being smaller than the surface of the substrate, wherein first developer nozzle is configured to form a puddle of a developer on a surface of the substrate held by the substrate holding unit by discharging the developer from the discharging port, and subsequently spread the puddle of the developer over the whole surface of the substrate by supplying the developer to the puddle with the contacting part contacting with the puddle and with the first developer nozzle moving from one of a central part and a peripheral part to the other of the central part and the peripheral part of the rotating substrate, thereby to perform a developing process of the substrate; and a second developer nozzle configured to supply, before or after preforming development using the first developer nozzle, the developer onto an underdeveloped area of the surface of the substrate with the substrate being rotated, thereby to accelerate development in the underdeveloped area and to uniformize, in a plane of the substrate, distribution of a degree of progress of development in the developing process using the first developer nozzle, wherein a developing process using the first developer nozzle and the supplying of the developer using the second developer nozzle are performed after removing the developer, having been supplied beforehand, from the surface of the substrate.

15. The developing apparatus according to claim 14, wherein the second developer nozzle is composed of the nozzle having the contacting part, and wherein the second developer nozzle performs a developing process with the contacting surface contacting with the puddle, which is formed on the substrate held by the substrate holding unit and is formed by discharging the developer from the discharging port.

16. The developing apparatus according to claim 15, wherein the first developer nozzle and the second nozzle are composed of a common nozzle.

* * * * *